US005455142A

United States Patent [19]

Takahashi et al.

[11] Patent Number: 5,455,142

[45] Date of Patent: Oct. 3, 1995

[54] IMAGE FORMATION PROCESS

[75] Inventors: Yohnosuke Takahashi; Hideyuki Nakamura; Fumiaki Shinozaki; Shinji Tsuno, all of Shizuoka, Japan

[73] Assignee: Fuji Photo Film Co., Ltd., Kanagawa, Japan

[21] Appl. No.: 964,052

[22] Filed: Oct. 21, 1992

[30] Foreign Application Priority Data

| | | | |
|---|---|---|---|
| Oct. 21, 1991 | [JP] | Japan | 3-272652 |
| Dec. 17, 1991 | [JP] | Japan | 3-333336 |

[51] Int. Cl.$^6$ .......... G03C 3/00

[52] U.S. Cl. .......... 430/254; 430/293; 430/233; 430/291; 430/143; 430/292; 430/252

[58] Field of Search .......... 430/293, 254, 430/253, 291, 143, 292, 252

[56] References Cited

U.S. PATENT DOCUMENTS

| | | | |
|---|---|---|---|
| 4,461,822 | 7/1984 | Abele | 430/291 |
| 4,806,451 | 2/1989 | Fröhlich | 430/293 |
| 4,980,261 | 12/1990 | Yamada | 430/253 |

FOREIGN PATENT DOCUMENTS

| | | |
|---|---|---|
| 3048248 | 3/1991 | Japan . |

*Primary Examiner*—Charles L. Bowers, Jr.
*Assistant Examiner*—Geraldine Letscher
*Attorney, Agent, or Firm*—Sughrue, Mion, Zinn, Macpeak & Seas

[57] ABSTRACT

An image formation process uses two light-sensitive elements comprising first and second adhesive light-sensitive layers which become nonadhesive upon exposure to light, respectively, and first and second toner elements comprising toner layers (a') and (b') of hues (a) and (b), respectively. The process steps include:

A) imagewise exposing the first light-sensitive layer;

B) contacting the first light-sensitive layer with layer (a') in the first toner element;

C) separating the first toner element and the first light-sensitive element, transferring the toner layer portion corresponding to the unexposed portion of the light-sensitive layer to the light-sensitive layer and leaving the toner layer portion corresponding to the exposed portion of the light-sensitive layer on the support for the first toner element;

D) contacting the adhesive surface of an image receiving element with the surface of the toner layer of the first toner element on which the toner layer has been left corresponding to the exposed portion of the first light-sensitive layer;

E) separating the image receiving element and the first toner element, transferring the toner layer to the image receiving element;

F) repeating A) to C) with the second light-sensitive element and toner element, respectively; and G) contacting the surface of the transferred toner layer of the image receiving element on which the hue (a) toner layer has been transferred with the surface of the hue (b) toner layer and separating the image receiving element and the second toner element, transferring the hue (b) toner layer to the image receiving element.

19 Claims, 5 Drawing Sheets

IMAGE FORMATION PROCESS

FIELD OF THE INVENTION

The present invention relates to an image formation process and a light-sensitive element for use in such an image formation process. The image formation process of the present invention is particularly useful in a process for the direct formation of a color proof from a digital image signal by a laser recording technique (Direct Digital Color Proof: DDCP), a process for making a multi-color display, etc.

BACKGROUND OF THE INVENTION

In the field of graphic arts, an image is printed on a printing plate through a set of color separation films made from a color original. In general, a color proof is made from the color separation film before the regular printing. The color proof is then checked for errors in the color separation process, the necessity of color correction, etc. It is said that as materials for color proofs there are preferably used pigments as coloring materials as well as image-forming materials to obtain a high approximation to printed matters. Further, in recent years, a dry proof preparation method free of developer has been desired in combination with a high resolving power enabling a high reproducibility of halftone images and a high process stability.

As a method for correction of color prints there has heretofore been used a method which comprises using a printing correcting machine to make a proof for color correction. However, this method consumes time and requires labor and a great deal of skill. Further, this method has a limited reliability.

On the other hand, as easier and simpler proof methods various photographic proof methods have been developed to replace this proof method. Among these photographic color proof methods, a color proof method using a photopolymer (preptess proof) is widely used.

A photopolymerizable system is a typical example of such a photopolymer system. Conventional processes for use with photopolymerizable systems involve exposure through a photographic intermediate film as a mask, and many such methods have been put into practical use as described hereinafter. In order to obtain a high image quality color proof, it is normally necessary to reproduce a halftone image having 150 lines per inch. This method essentially provides a high resolving power. Most initiators for the conventional photopolymerization system are sensitive to the near ultraviolet range. the other hand, as disclosed in U.S. Pat. No. 4,162,162 many spectral sensitizers which are sensitive up to the visible light range have heretofore been developed. Thus, it has become relatively easy to realize a high recording sensitivity to lasers in the visible light range such as argon ion lasers and helium-cadmium lasers.

The recent spread of electronized systems in the prepress process and the requirement to shorten the process time and reduce the amounts used of expendables such as films have caused an increasing demand for recording materials and systems for preparing a color proof directly from a digital image signal without going through an intermediate material such as lith film. It is thus desired to use as a recording head a laser which can be modulated by a digital signal and can be converged to a fine recording beam to record a high image quality proof from the digital signal. To this end, the recording material requires a high resolving power enabling halftone reproduction as well as a high recording sensitivity to a laser beam.

However, an essential problem is that materials have not yet been developed which can provide direct recording of a digital signal and can be put into practical use.

The above mentioned photopolymerizable system has a high potential possibility of being used for digital image recording from the standpoint of resolving power and laser recording sensitivity, but nothing practicable has yet been obtained. The conventional photographic multi-color image recording technique using a photopolymerizable material will be outlined below, and its problems against the objects of the present invention will also be discussed below.

Conventional photographic methods of correcting color prints include the overlay process and the surprint process. In the overlay process, a plurality of color proofing sheets comprising various color separation images formed on transparent supports are prepared. These color proofing sheets are laminated for color proofing (such a laminate is called a "color test sheet").

The overlay process is simple and inexpensive and has the advantage that the lamination of only two or three colors allows a continuous check. However, the overlay process is disadvantageous in that the lamination of a plurality of synthetic resin sheets gives a slightly dark color test sheet and in that the incident light beam reflects from some of these sheets, making a big difference between the impression on the color test sheet and that on printed matters prepared by printing machines.

On the other hand, in the surprint process, several colored images are superimposed on a single support. To this end, various colored layers are applied to a single opaque base or corresponding toners are sequentially applied to the opaque base. This lamination process is advantageous in that the color density is not affected by the synthetic resin base. This process is also advantageous in that it is easy to use as a coloring material a pigment having the same or close to the same hue as the pigment used in printing ink. Thus, this process has been widely used.

As an example of the surprint process, there has a known process comprises imagewise exposing to light a light-sensitive transfer material comprising on a tentative support a release layer made of an organic polymer, a coloring material layer and a light-sensitive layer sequentially laminated thereon, wet-developing the material to form a colored image on the release layer, and then transferring the colored image with the release layer to any support (permanent support) using an adhesive (JP-B-46-15326 and U.S. Pat. No. 3,721,557). This process can be advantageously used as a color proofing process for various operations such as overlay type and surprint type operations. However, this process is disadvantageous in that various colors are sequentially transferred on a paper support having a poor dimensional stability, making it difficult to maintain a high precision of registration of the various colors. Further, the image thus obtained has a poor mechanical strength.

As an approach for eliminating these difficulties, a process which comprises the transfer of an image to a tentative image receiving sheet (image receiving element) before the transfer of the image to a permanent support is described in U.S. Pat. No. 4,482,625 to the present inventors. That is, this process comprises the steps of preparing a tentative image receiving element comprising an image receiving layer made of a photopolymerizable material on a support, transferring various color images to the tentative image receiving element before the transfer to a permanent support, retransferring the images to the permanent support, and then entirely exposing the material to light so that the photopolymerizable image receiving layer thus transferred is cured. In this process, the registration and transfer of the various color images can be effected on a support having a high dimensional stability such as polyethylene terephthalate. This gives improvements in the precision of registration as well as the quality stability. Further, the photo-set layer having a great hardness protects the final image, rendering the mechanical strength of the image excellent.

However, this process theoretically has an essential problem of wet development. Further, from the standpoint of adaptability to laser recording, the use of a dye sensitizer spectrally sensitive to radiation from the visible light range to the infrared range theoretically enables laser recording. However, since the light-sensitive layer and the coloring material layer are the same layer or adjacent to each other, both of these two layers are transferred to the image receiving layer. The hue of the resulting image is greatly changed due to the colored sensitizer, making it impossible to put this process into practical use.

Many multi-color image formation processes which eliminate the above mentioned disadvantages of wet development processes have been heretofore proposed and partly put into practical use. Examples of these multicolor image formation processes are described in U.S. Pat. Nos. 3,060,024, 3,582,327, and 3,620,726. In these processes, an adhesive photopolymerizable copying material comprising a support layer and a photopolymerizable layer containing at least one addition-polymerizable monomer and a photopolymerization initiator is cured upon imagewise exposure to light to lose its adhesivity. The resulting latent image can be visuallized by the addition of a proper powdered toner material. This toner is attached to only the unexposed adhesive region. The toner can be removed from the exposed nonadhesive image region. This process is a dry development process requiring no developer. Because of its simplicity and convenience, this process is widely used in proofs using a color separation film.

However, this process is disadvantageous in that the powdered toner can contaminate the working atmosphere and there can easily become a difference in the way of applying/removing the powder toner among individuals. Thus, this process has been keenly desired to be improved.

As an approach for improving the above mentioned process using an adhesive photopolymerizable lightsensitive layer, the use of a toner in the form of film is disclosed in U.S. Pat. No. 4,806,451 and JP-A-2-14985 (the term "JP-A" as used herein means an "unexamined published Japanese patent application"). In this process, as in the above mentioned process, a lightsensitive layer which is adhesive when not exposed to light but loses its adhesitivity upon exposure/curing comprises a photopolymerizable monomer and a photopolymerization initiator. The light-sensitive layer is laminated on a receiver base such as paper together with a support. The latent image which has been exposed upon imagewise exposure and peeling of the light-sensitive layer support is then brought into contact with a film toner provided on a separate support. The toner is transferred to the latent image under heating and/or pressure for development. Among the above two cited patent applications, the former is characterized by mixing an incompatible polymer as a binder in the toner layer while the latter is intended to improve the image quality by properly selecting the thermal and mechanical properties of the binder polymer to be contained in the toner layer. Both of the two processes are intended to eliminate the disadvantages of the above mentioned process with a powdered toner. These processes provide an excellent approximation to printed matters (pigment image formation on a regular printing paper) and enable dry development. These processes provide improvements in the quality stability. Thus, these processes are considered remarkably desirable as compared with the conventional processes.

However, the use of such a film toner leaves much to be desired.

Firstly, since the registration of imagewise exposure of the light-sensitive layer is repeated on a paper support having a poor dimensional stability, the various color images can easily deviate from each other in position. Further, the final image has a low mechanical strength. In order to render the final image scuff-resistant and adhesion-resistant, it is necessary to add a complicated process such as lamination of a protective layer on the final image.

Moreover, this process gives essential restrictions on the object of the present invention in which a high image quality color proof is obtained directly from a digital image signal without going through an intermediate film.

Using the process described in the above cited U.S. Patent Nos. 4,806,451 and 4,935,331, laser recording can be effected merely by combining the photopolymerization initiator described in the above cited JP-A-54-155292 with a visible light from an argon laser. However, since photopolymerization initiators sensitive to the visible light range or longer wavelength ranges exhibit a strong absorption in the visible light range, a photopolymerizable light-sensitive layer comprising these initiators cannot be prevented from being colored. Accordingly, if laser recording and image formation are effected in accordance with the process disclosed in these patent applications, the resulting image is stained by colors developed by the initiator, and the portion which should be essentially colorless is heavily colored, making it difficult to put this process into practical use.

SUMMARY OF THE INVENTION

It is therefore an object of the present invention to provide a dry image formation process for recording an image with a high image quality and an excellent quality stability and a light-sensitive element for use in such an image formation process. More particularly, it is an object of the present invention to provide a process for the direct formation of a color proof having a high approximation to printed matter by a laser light modulated by a digital image signal.

These and other objects of the present invention will become more apparent from the following detailed description and examples.

These objects of the present invention are accomplished by the following image formation processes and light-sensitive elements for use in such image formation processes:

1. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (b) and a different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing the adhesive surface of an image receiving element comprising on a support an image receiving layer having a surface adhesive to said first toner layer into face-to-face contact with the surface of the toner layer of said first toner element on which the toner layer has been left corresponding to the exposed portion of said first light-sensitive layer;

E) separating said image receiving element and said first toner element from each other to transfer the toner layer to said image receiving element;

F) repeating said steps A) to C) with said second light-sensitive element and said second toner element comprising said toner layer (b'); and G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element.

2. An image formation process with a light-sensitive element comprising on a support a light-sensitive layer which is adhesive when not exposed to actinic light but becomes adhesive after being exposed to actinic light and a toner element comprising on a support a toner layer (a') containing a binder and a coloring material having at least a hue (a), which comprises the step of:

A) imagewise exposing said light-sensitive layer to actinic light to form a latent image therein;

B) bringing said light-sensitive layer in which a latent image has been imagewise formed into face-to-face contact with said toner layer (a') having a hue (a); and C) separating said toner element and said light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said toner element, characterized in that said light-sensitive element includes between said light-sensitive layer and said support a layer comprising a light-insensitive polymer and having a softening temperature of about 80° C. or lower as determined by the Vicat process.

3. An image formation process with first and second light-sensitive elements comprising on separate supports first and second light-sensitive layers which are adhesive when not exposed to actinic light but become nonadhesive after exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (b) different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing an image receiving element comprising on a support an image receiving layer having a surface adhesive to said first toner layer into face-to-face contact with said first toner element on which the first toner layer has been left corresponding to the exposed portion of the light-sensitive layer;

E) separating said image receiving element and said first toner element from each other to transfer the toner layer which has been left corresponding to the exposed portion of said first light-sensitive layer to said image receiving element;

F) repeating said steps A) to C) with said second light-sensitive element and said second toner element comprising said toner layer (b'); and G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element, characterized in that as said light-sensitive element includes between said light-sensitive layer and said support a layer comprising a light-insensitive polymer and having a softening temperature of 80° C. or lower as determined by the Vicat process.

4. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (b) different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing the adhesive surface of an image receiving element comprising on a support an image receiving layer having a surface adhesive to said first toner layer into face-to-face contact with the surface of the toner layer of said first toner element on which the toner layer has been left corresponding to the exposed portion of said first light-sensitive layer;

E) separating said image receiving element and said first toner element from each other to transfer the toner layer to said image receiving element;

F) repeating said steps A) to C) with said second light-sensitive element and said second toner element comprising said toner layer (b'); and G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element, characterized in that the process further comprises a step of bringing said image receiving element comprising a toner layer formed in the step (G) into face-to-face contact with a final support under heating and/or pressure and then separating said image receiving element and said final support from each other to simultaneously transfer multi-color toner layers on said image receiving layer to said support.

5. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (b) different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing the adhesive surface of an image receiving element comprising on a support an image receiving layer having a surface adhesive to said first toner layer into face-to-face contact with the surface of the toner layer of said first toner element on which the toner layer has been left corresponding to the exposed portion of said first light-sensitive layer;

E) separating said image receiving element and said first toner element from each other to transfer the toner layer to said image receiving element;

F) repeating said steps A) to C) with said second light-sensitive element and said second toner element comprising said toner layer (b');

G) bringing the surface of the transferred toner layer of said image. receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element; and H) bringing said image receiving element comprising a toner layer formed in the step (G) into face-to-face contact with a final support under heating and/or pressure and then separating said image receiving element and said final support from each other to simultaneously transfer multi-color toner layers on said image receiving layer to said support, characterized in that said light-sensitive element includes between said light-sensitive layer and said support a layer comprising a light-insensitive polymer and having a softening temperature of about 80° C. or lower as determined by the Vicat process.

Preferred embodiments of the image formation process and light-sensitive element of the present invention will be given below.

(1) An image formation process as defined above, wherein the process further comprises after the step (G) a step of bringing the surface of the multi-color toner layers formed on said image receiving element up to the step (G) into face-to-face contact with a final image support under heating and/or pressure and then separating said image receiving element and said final image support from each other to simultaneously transfer multi-color toner layers on said image receiving layer to said final image support.

(2) An image formation process as defined above, wherein the exposure to actinic light is effected by converging and scanning a laser beam onto the light-sensitive layer.

(3) An image formation process as defined above, wherein said laser beam is a light beam emitted from an argon ion laser, a helium neon laser, a helium cadmium laser, a dye laser, a semidonductor laser, a YAG laser or an eximer laser or is a light beam obtained by passing the laser light beam through a secondary harmonic element so that the wavelength thereof is halved.

(4) An image formation process as defined above, wherein said toner layer comprises a toner element containing at least one plasticizer besides said coloring material and binder.

(5) An image formation process as defined above, wherein said binder contained in said toner element is an organic polymer having a molecular weight of 10,000 or more.

(6) An image formation process as defined above, wherein said binder contained in said toner element is an organic polymer having a glass transition temperature of not lower than room temperature.

(7) An image formation process as defined above, wherein said plasticizer contained in said toner element is made of one or more plasticizers selected from the group consisting of ester phosphates, ester acrylates, polyol esters and epoxy compounds.

(8) An image formation process as defined above, wherein the amount of the plasticizer to be contained in said toner layer is in the range of 2 to 100% by weight based on the total weight of the coloring materials and binders forming said toner layer.

(9) An image formation process as defined above, wherein said light-sensitive layer comprises at least a photopolymerizable monomer and/or oligomer, a binder polymer and a photopolymerization initiator.

(10) An image formation process as defined above, wherein a cover film is laminated on the surface of the light-sensitive layer opposite the support when imagewise exposure to actinic light is effected and wherein after imagewise exposure said cover film is peeled off the light-sensitive layer before the light-sensitive layer is brought into face-to-face contact with the toner layer.

(11) An image formation process as defined above, wherein the light-sensitive layer which has been exposed to actinic light is heated and/or pressed when brought into face-to-face contact with the toner layer.

(12) An image formation process as defined in (11) above, wherein the heating and/or pressing conditions are adjusted such that they are the same for toner layers having at least two different hues.

(13) An image formation process as defined above, wherein when the toner layer which has been left on the toner layer support corresponding to the imagewise pattern formed by exposure to actinic light is brought into face-to-face contact with the image receiving element, said toner layer and/or said image receiving element is heated and/or pressed.

(14) An image formation process as defined in (13) above, wherein the heating and/or pressing conditions are adjusted such that they are the same for toner layers having at least two different hues.

(15) An image formation process as defined above, wherein said image receiving element for receiving the toner layer which has been imagewise left on the toner layer support comprises at least an image receiving element support and an image receiving layer formed thereon.

(16) An image formation process as defined above, wherein said image receiving layer comprises at least a film-forming polymer.

(17) An image formation process as defined above, wherein said image receiving element support is a polyethylene terephthalate.

(18) An image formation process as defined above, wherein said image receiving layer comprises a plasticizer besides the film-forming polymer.

(19) An image formation process as defined above, wherein at least a part of said plasticizer contained in said image receiving layer is a photopolymerizable monomer and/or oligomer.

(20) An image formation process as defined above, wherein said image receiving layer comprises a photopolymerization initiator.

(21) An image formation process as defined above, wherein said image receiving element exhibits substantially no absorption in the visible light range.

(22) An image formation process as defined above, wherein when the multi-color image formed on said image receiving layer is transferred to the final support, at least a part of the image receiving layer on the image receiving support is transferred to the surface on the final support side simultaneously with the toner layer.

(23) An image formation process as defined above, wherein when the image receiving element on which the multi-color image has been formed is brought into face-to-face contact with the final image support and then separated from the final image support, it is entirely irradiated with at least ultraviolet light before and after or during the separation from the final image support.

(24) An image formation process as defined above, wherein said final image support is paper.

(25) An image formation process as defined above, wherein when recording is effected with a laser beam, the laser beam is scanned and signal-modulated in counter response to the original image as viewed from the light-sensitive layer (or cover film) side to form a latent image therein.

(26) An image formation process as defined above, wherein said layer having a softening temperature of about 80° C. or lower as determined by the Vicat process contains an ethylene polymer or copolymer.

(27) An image formation process as defined above, wherein said ethylene copolymer is an ethylenevinyl acetate copolymer or an ethylene-ester acrylate copolymer.

(28) An image formation process as defined above, wherein the thickness of said layer having a softening temperature of about 80° C. or lower as determined by the Vicat process is in the range of about 3 to 100 μm.

(29) An image formation process as defined above, wherein said light-sensitive layer is a photopolymerizable layer.

In accordance with the image formation process of the present invention, a dry development process can be used to obtain a color image. In particular, the image formation process of the present invention has a remarkable feature in that it can directly provide a color proof by a laser beam digitally modulated by an image signal.

In accordance with the image formation process of the present invention, an image formed from a pigment as a coloring material can be formed on a printing paper, thus providing a proof having a high approximation to printed matter. The image thus obtained is insusceptible to discoloration due to sensitizing dyes.

In accordance with the image formation process of the present invention, registration of color is effected on a plastic support having an excellent dimensional stability, providing a high process stability. The image thus obtained is excellent in mechanical strength.

BRIEF DESCRIPTION OF THE DRAWINGS

By way of example and to make the description more clear, reference is made to the accompanying drawings in which.

DETAILED DESCRIPTION OF THE INVENTION

The present invention will be further described with reference to the drawings.

In the above mentioned color proof process, images with four kinds of hues, i.e., yellow, magenta, cyan and black are normally formed. These images are then superimposed upon each other to obtain an image for full-color simulation.

The light-sensitive element of the present invention for imagewise exposure and the toner element of the present invention on which a color image is to be formed can be prepared by, e.g., the following process.

Figure 1:
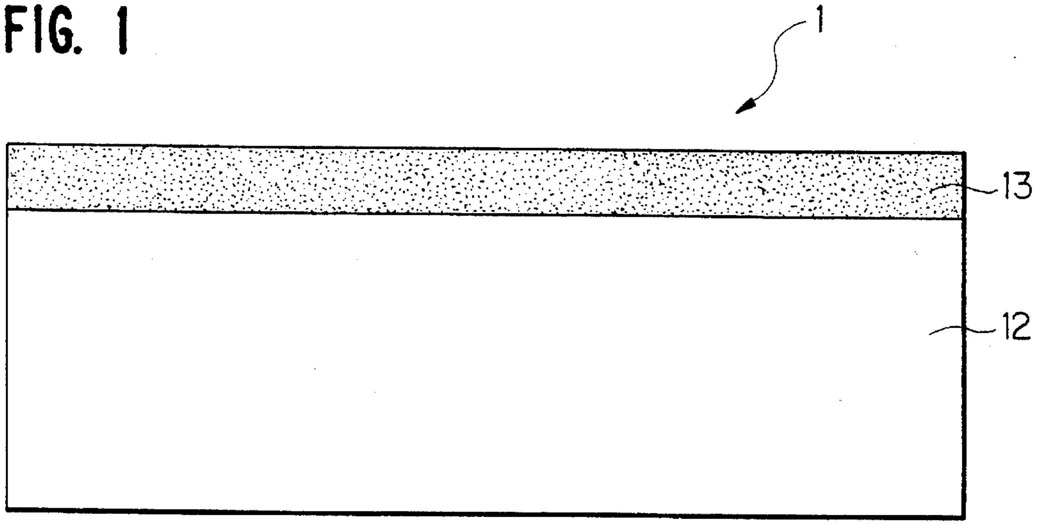
FIG. 1 is a sectional view diagramatically illustrating the section of an embodiment of the light-sensitive element used in the image formation process of the present invention.

FIG. 1 is a sectional view diagramatically illustrating the section of a light-sensitive element used in the present invention. In FIG. 1, a light-sensitive element 11 comprises a light-sensitive layer 13 provided on a support 12.

The support 12 is not specifically limited so long as it is in the form of a film or tablet. The support 12 may be made of any suitable material. Examples of such a support material include high molecular compounds such as polyethylene terephthalate, polycarbonate, polyethylene, polyvinyl chloride, polyvinylidene chloride, polystyrene and styreneacrylonitrile copolymer. In particular, biaxially oriented polyethylene terephthalate films are preferred in the light of mechanical strength and dimensional stability to heat. The preferred thickness of the support 12, if it is in the form of film, is normally in the range of 10 to 400 μm, particularly 25 to 200 μm. As the support there may be used glass plate, metal plate or the like depending on its purpose. Either the support 12 or a cover sheet as described later needs to be in the form of film and is preferably transparent to actinic light.

The support 12 may be laminated with an interlayer or subjected to surface treatment to enhance the adhesion to the light-sensitive layer. As such an interlayer there can be properly selected from film-forming polymers taking into account the adhesion between the support and the light-sensitive layer and the solubility in the solvent during the coating of the light-sensitive layer. The thickness of the interlayer is not specifically limited but is normally in the range of about 0.01 to 2 μm. As the means of enhancing the adhesion between the support and the light-sensitive layer there may be particularly preferably used a physical treatment such as glow discharge or corona discharge of the surface of the support.

As the light-sensitive layer 13, any kind of material can be used so long as it is adhesive when not exposed to actinic light but becomes nonadhesive upon exposure to actinic light. As such a material there can be used a system obtained by blending a light-sensitive compound such as vinyl cinnamate and a light-sensitive azide compound in a polymer. In light of sensitiveness to light, the most preferable system is a photopolymerizable system.

A preferred photopolymerizable light-sensitive layer to be used in the present invention comprises (i) at least one multifunctional vinyl or vinylidene compound capable of undergoing addition polymerization to produce a photopolymer, (ii) an organic polymer binder, and (iii) a photopolymerization initiator which is activated by actinic light, and optionally additives such as a thermal polymerization inhibitor and a surface active agent.

Examples of suitable vinyl or vinylidene compounds which can be used in the present invention include unsaturated esters of polyol (particularly acrylic or methacrylic esters, e.g., ethylene glycol diacrylate, glycerin triacrylate, ethylene glycol dimethacrylate, 1,3-propanediol dimethacrylate, polyethylene glycol dimethacrylate, 1,2,4-butanetriol trimethacrylate, trimethylol ethanetriacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol-diacrylate, bisacrylate and bismethacrylate of polyethylene glycol having a molecular weight of 200 to 400, and analogous compounds), and unsaturated amides (particularly unsaturated amides of acrylic acid and methacrylic acid containing α,ω-diamine whose alkylene chain may be opened by a carbon atom, and ethylene bis-methacrylate). Further, polyester acrylates obtained by the condensation of an ester of a polyvalent alcohol and a polyvalent organic acid with acrylic acid or methacrylic acid can be used. However, the present invention should not be limited to these compounds.

The light-sensitive layer of the present invention comprises at least one binder. This binder is one of the major factors determining not only the rigidity but also the adhesion of the light-sensitive layer. The binder suitable for the light-sensitive layer of the present invention is a thermoplastic resin or a mixture thereof. Examples of such a thermoplastic resin include single polymers or copolymers of acrylic monomers such as acrylic acid, methacrylic acid, acrylic ester and methacrylic ester, cellulose polymers such as methyl cellulose, ethyl cellulose and cellulose acetate, vinyl polymers and copolymers thereof such as polystyrene, polyvinyl chloride, vinyl chloride-vinyl acetate copolymer, polyvinyl pyrrolidone, polyvinyl butyral and polyvinyl alcohol, condensed polymers such as polyesters and polyamides, rubber polymers such as chlorinated rubbers and butadiene-styrene copolymers, and polyolefin polymers such as chlorinated polyethylenes and chlorinated polypropylenes. Among these thermoplastic resins, copolymers of various acrylic monomers allow easy control of thermal properties such as softening point in a wide range and exhibit an excellent compatibility with photopolymerizable monomers and thus are preferred. These polymers each have an average molecular weight of about 10,000 to 2,000,000. The proper mixing ratio of photopolymerizable monomer to organic polymer binder depends on the combination of monomer compound and binder to be used but is normally in the range of about 0.1:1.0 to about 2.0:1.0 by weight.

As the photopolymerization initiator to be contained in the photopolymerizable light-sensitive layer there can be particularly preferably used a photopolymerization initiator which exhibits absorption and activity in a wavelength range longer than the visible light range and a high photosensitiviity to laser light. As such photopolymerization initiators there are known many systems obtained by the combination of radical generators and various dyes as spectral sensitizers. For example, a combination of an imidazole dimer as a radical generator and an acridine dye (JP-A-54-155292) or a triazine dye (TAGA Proceedings, 1985, page 232) as a dye, a combination of N-phenyl glycine as a radical generator and a ketocoumarin dye (Polymer Eng. Sci., 23, 1022 (1983)) as a dye, a combination of an iodine salt as a radical generator and various dyes (JP-A-60-76740, JP-A-60-78443, JP-A-60-88005), a combination of a triazine compound as a radical generator and an aromatic ketone derivative as a dye (Nihon Kagakukaishi, 1984, page 192), etc. are known. Further, alkyl borates of dyes such as cyanine, rhodamine and safranine are known as useful visible light photopolymerization initiators (U.S. Pat. Nos. 4,772,541, 4,800,149 and 4,865,942). These known photopolymerization initiators can be used in the present invention.

In the present invention, photopolymerization initiators which exhibit absorption and activity in the near ultraviolet range may be used singly or in combination with the above mentioned photopolymerization initiators depending on the purpose. Examples of such photopolymerization initiators which exhibit absorption and activity in the near ultraviolet range include aromatic ketones such as benzopheone, Michler's ketone, 4,4'-bis(dimethylamino)benzophenone, 4-methoxy-4'-dimethylaminobenzophenone, 2-ethylanthraquinone, and phenonethraquinone, benzoin ethers such as benzoin, benzoin methyl ether, benzoin ethyl ether and benzoin phenyl ether, benzoins such as methyl benzoin and ethyl benzoin, and dimers such as 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-4,5-diphenylimidazole dimer, 2-(p-methylmercaptophenyl)-4,5-diphenylimidazole dimer, and 2,4,5-triacrylimidazole dimer as disclosed in U.S. Pat. Nos. 3,476,185 and 3,784,557, and British Patent 1,047,569.

The amount of the photopolymerization initiator to be added is preferably in the range of about 0.01 to 30% by weight based on the weight of photopolymerizable monomer compound.

The light-sensitive layer may comprise a thermal polymerization inhibitor incorporated therein. Examples of such a thermal polymerization inhibitor include p-methoxyphenol, hydroquinone, alkyl-substituted hydroquinone, aryl-substituted hydroquinone, tertiary butyl catechol, pyrogallol, naphthylamine, β-naphthol, phenothiazine, pyridine, nitrobenzene, ϕ-toluthinone and aryl phosphite. However, the present invention should not be limited to these compounds.

The light-sensitive layer may further comprise a printing-out agent which colors to form a visible image upon image-wise exposure to actinic light. The printing-out agent can be selected from known compounds.

Examples of other components which can be incorporated in the light-sensitive layer include a plasticizer, a remaining solvent, a surface active agent and an inactive filler.

The thickness of the light-sensitive layer is normally in the range of about 0.1 to 100 μm, preferably about 1 to 50 μm.

The light-sensitive layer 13 preferably comprises a cover film (not shown) provided on the surface opposite the support 12 to protect the light-sensitive layer before recording and lessen the effect of inhibiting polymerization by oxygen in the air upon exposure. Examples of cover film materials which can be used for this purpose include high molecular compounds such as polyethylene terephthalate, polycarbonate, polyethylene, polypropylene, polyvinyl chloride, polyvinylidene chloride, polystyrene and styrene-acrylonitrile copolymer. Particularly preferred among these materials are polyethylene, polypropylene and polyethylene terephthalate. The thickness of the cover film is preferably in the range of about 5 to 400 μm, particularly 10 to 200 μm.

On the surface of the cover film to be brought into contact with the light-sensitive layer, a release layer made of silicone resin or the like may be provided to reduce the adhesion of the cover film to the light-sensitive layer. The thickness of the release layer is not specifically limited but is preferably in the range of about 0.01 to 2 μm.

Figure 2:
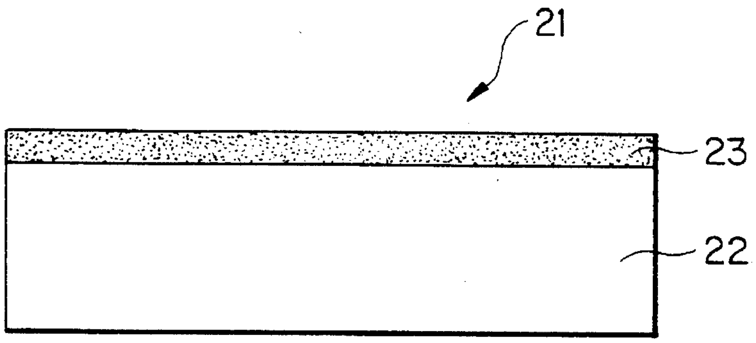
FIG. 2 is a sectional view diagramatically illustrating the section of an embodiment of the toner element used in the image formation process of the present invention.

FIG. 2 is a sectional view diagramactically illustrating the section of an embodiment of the toner element used in the present invention.

In FIG. 2, a toner element 21 comprises a toner layer 23 provided on a support 22.

The support 22 is not specifically limited so long as it is in the form of a film. The support 22 may be made of any suitable material. Examples of such a support material include high molecular compounds such as polyethylene terephthalate, polycarbonate, polyethylene, polyvinyl chloride, polyvinylidene chloride, polystyrene and styrene-acrylonitrile copolymer. In particular, biaxially oriented polyethylene terephthalate films are preferred in light of mechanical strength and dimensional stability to heat. The preferred thickness of the support 22 is normally in the range of about 5 to 400 μm, particularly 1 about 0 to 100 μm.

The support 22 may be optionally laminated with an interlayer or subjected to physical surface treatment to reduce or enhance the adhesion to the toner layer. Such an interlayer can be properly selected from film-forming materials taking into account the adhesion to the toner layer and the solubility in the solvent during the coating of the toner layer. In order to reduce the adhesion to the toner layer, silicone resins such as poly(dimethylsiloxane) and water-soluble polymers such as gelatin and polyvinyl alcohol may be used. The thickness of the interlayer is not specifically limited but is normally in the range of about 0.01 to 5 μm. As the means of enhancing the adhesion between the support and the toner layer there may be particularly preferably used a physical treatment such as glow discharge or corona discharge of the surface of the support.

The toner layer can be usually obtained by coating on a support a solution and/or dispersion of a toner material composition in a solvent, and then drying the material. A typical toner layer comprises at least one coloring material and binder.

As such a coloring material there can be used a pigment or dye. Pigments can be roughly divided into two groups, i.e., organic pigments and inorganic pigments. The former are excellent in the transparency of coat, and the latter are excellent in the opacity of coat. If the image formation process of the present invention is used in printing color proofs, organic pigments having hues corresponding to or close to yellow, magenta, cyan and black are used in the printing ink. In addition, metal powder, fluorescent pigment, etc. may be used depending on the purpose. Examples of pigments which can be preferably used include azo series pigments, phthalocyanine series pigments, threne series anthraquinone pigments, dioxazine series pigments, quinacridone series pigments, and isoindolione series pigments.

The pigment is typically dispersed in an organic solvent or aqueous dispersant with an organic binder. The pigment is crushed to such an extent that the color and picture quality of the corresponding image can be reproduced. In general, the average grain diameter of the pigment thus crushed is preferably not greater than 1 μm.

Some examples of the many pigments and dyes known in the art will be given below (C. I. stands for color index).

Victoria Pure Blue (C. I. 42593)
Auramine O (C. I. 41000)
Cathyrone Brilliant Flavin (C. I. Basic 13)
Rhodamine 6GCP (C. I. 45160)
Rhodamine B (C. I. 45170)
Safraine OK 70:100 (C. I. 50240)
Erioglaucine X (C. I. 42080)
Fast Black HB (C. I. 26150)
No. 1201 Lionol Yellow (C. I. 21090)
Lionol Yellow GRO (C. I. 21090)
Shimura Fast Yellow 8GF (C. I. 21105)
Benzidine Yellow 4T-564D (C. I. 21095)
Shimura Fast Red 4015 (C. I. 12355)
Lionol Red 7B4401 (C. I. 15850)
Fast Gen Blue-TGR-L (C. I. 74160)
Lionol Blue SM (C. I. 26150)
Mitsubishi Carbon Black MA-100
Mitsubishi Carbon Black #40

Besides these pigments, a processed pigment obtained by dispersing a finely divided pigment in a polymer carrier as produced by and available from Ciba Geigy, etc. can be used. Examples of such a processed pigment include Micro Lith Yellow 4GA, Micro Lith Yellow 2R-A (C. I. 21108), Micro Lith Yellow MX-A (C. I. 21100), Micro Lith Blue 4G-A (C. I. 74160), Micro Lith Red 3R-A, Micro Lith Red 2C-A, Micro Lith Red 2B-A, and Micro Lith Black C-A.

The toner layer comprises at least one binder to control its film properties and brittleness. The binder is also used to control the rheological properties of the coat as well as to stabilize the pigment in the dispersion system. Typically, the pigment and binder or a part of the binder are crushed in a mill until the desired grain diameter and color are obtained. The paste thus obtained is then diluted with a solvent or a mixture of solvents to obtain a dispersion having the desired viscosity.

In order to obtain a high image quality when the toner layer is selectively transferred in response to the imagewise exposed and unexposed portions of the light-sensitive layer, both the shear breaking strength and elongation of the toner layer coat to be used in the present invention are preferably small. To this end, the binder suitable for the toner layer is preferably brittle at a temperature of at least the toner development temperature. From this standpoint, the binder, if it is a polymer having a glass transition temperature Tg, preferably has a Tg of not lower than at least room temperature.

If the molecular weight of the binder polymer is not large enough, the binder can easily soften or melt when the toner layer is laminated on the light-sensitive layer on which recording has been made under heating and pressure. This increases the adhesion of the toner layer to the exposed portion of the light-sensitive layer, which is not desired to adhere to the toner layer, causing a drop in the resolving power. Therefore, the molecular weight of the binder polymer is preferably about 10,000 or more.

The binder suitable for this layer is a thermoplastic resin or a mixture thereof. In the case where thermoplastic resins are used in admixture, two or more resins may be compatible or incompatible with each other. Specific examples of preferred binders include cellulose derivatives such as methyl cellulose, ethyl cellulose and cellulose triacetate, single polymers or copolymers of acrylic monomers such as acrylic acid, methacrylic acid, ester acrylate and ester methacrylate, styrene/maleic anhydride resin, and half esters thereof.

In a preferred embodiment, the mixing proportion of pigment and binder depends on the combination of pigment and binder but is preferably in the range of about 100:20 to about 100:300 by weight.

Both the pigment and binder contained in the toner layer thus formed are brittle. This is desirable for high monochromatic image quality. However, it is difficult to adhere a plurailty of these toner layers to obtain a multi-color image. It is thought that the use of a polymer which softens under heating and pressure as the binder to be contained in the toner layer enhances the adhesion between these toner layers. However, such a polymer may cause a drop in the image quality as mentioned above. The inventors reviewed various additives for toner layers. As a result, it was found that the addition of a plasticizer preferably helps meet the requirements both for image quality and multi-color development. The mechanism of the activity of a plasticizer in the present invention is unknown. It can be presumed that in the pigment-polymer composite system the plasticizer serves to enhance the adhesion between toner layers without remarkably increasing the adhesion to the exposed portion of the light-sensitive layer and the shear breaking strength of the toner layer. Further, as illustrated later in the examples, the plasticizer contributes to reducing the adhesion between the toner layer and its support, thus greatly accelerating the transfer from the toner element to the image receiving layer. This is another important factor.

In other words, the plasticizer is added to the toner layer to improve the adhesion between toner layers having different hues, accelerating the transfer to the image receiving element. The plasticizer to be used can be properly selected depending on the combination of coloring material and binder. Examples of low molecular plasticizers include ester phthalates such as dibutyl phthalate (DBP), di-n-octyl phthalate, di(2-ethylhexyl) phthalate (DOP), dinonyl phthalate (DNP), dilauryl phthalate (DLP), butyl lauryl phthalate (BLP) and butyl benzyl phthalate (BBP), aliphatic dibasic acid esters such as di(2-ethylhexyl) azipate (DOA) and di(2-ethylhexyl) sebacate, triester phosphates such as tricresyl phosphate (TCP) and tri(2-ethylhexyl) phosphate (TOF), polyol esters such as polyethylene glycol ester, and epoxy compounds such as epoxy aliphatic ester. However, the present invention should not be limited to these compounds.

Besides these ordinary plasticizers, ester arylates such as polyethylene glycol dimethacrylate, 1,2,4-butanetriol trimethacrylate, trimethylolethane triacrylate, pentaerythritol triacrylate, pentaerythritol tetraacrylate and dipentaerythritol polyacrylate can be preferably used depending on the kind of the binder used.

These plasticizers may be used singly or in admixture. These plasticizers may comprise a secondary plasticizer (auxiliary plasticizer) such as polyparaffin chloride incorporated therein before use.

The amount of the plasticizer to be incorporated in the toner layer depends on the combination of pigment and binder, but the proportion of the total weight of pigment and binder to the weight of plasticizer is in the range of about 100:1 to about 100:200, preferably about 100:2 to 100:100.

In addition to the above mentioned components, the toner layer may comprise a surface active agent, a thickening agent, a dispersion stabilizer, an adhesion accelerator and other additives incorporated therein. The dry thickness of the toner layer depends on the purpose but is normally not greater than 10 μm, preferably in the range of about 0.1 μm to 4 μm.

The surface of the toner layer of the present invention may optionally comprise a cover film (not shown) to protect the toner layer against damage during handling and inhibit the adhesion between the film surfaces during storage. Examples of cover film materials which can be used for this purpose include high molecular compounds such as polyethylene terephthalate, polycarbonate, polyethylene, polypropylene, polyvinyl chloride, polyvinylidene chloride, polystyrene and styrene-acrylonitrile copolymer. Particularly preferred among these materials are polyethylene, polypropylene and polyethylene terephthalate. The thickness of the cover film is preferably in the range of about 5 to 400 μm, particularly about 10 to 100 μm. The surface of the cover film to be brought into contact with the toner layer may be subjected to the same surface treatment as effected for the cover film for the light-sensitive layer to control the adhesivity of the cover film.

Figure 3:
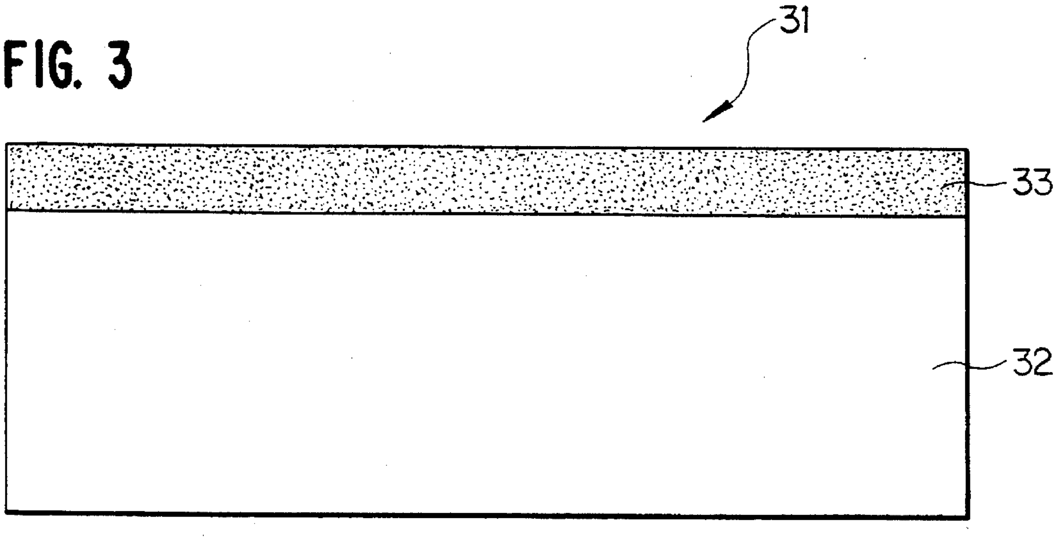
FIG. 3 is a sectional view diagramatically illustrating the section of an embodiment of the image receiving element used in the image formation process of the present invention.

FIG. 3 is a sectional view diagramatically illustrating the section of an embodiment of the image receiving element used in the present invention. In FIG. 3, an image receiving element 31 comprises an image receiving layer 33 provided on a support 32.

The support 32 is not specifically limited so long as it is in the form of a film or tablet. The support 32 may be made of any suitable material. Examples of such a support material include high molecular compounds such as polyethylene terephthalate, polycarbonate, polyethylene, polyvinyl chloride, polyvinylidene chloride, polystyrene and styreneacrylonitrile copolymer. In particular, biaxially oriented polyethylene terephthalate films are preferred in light of mechanical strength and dimensional stability to heat and water. The preferred thickness of the support 32, if it is in the form of a film, is normally in the range of about 10 to 400 μm, particularly about 25 to 200 μm. The support 32 may be made of glass plate, metal plate or the like depending on the purpose.

The support 32 may be laminated with an interlayer or subjected to a physical surface treatment to enhance the adhesion to the image receiving layer 33. Such an interlayer can be properly selected from film-forming polymer materials taking into account the adhesion to both the support and the image receiving layer. The thickness of the interlayer is not specifically limited but is normally in the range of about 0.01 to 2 μm. As the means of enhancing the adhesion between the support and the image receiving layer there may be particularly preferably used a physical treatment such as glow discharge or corona discharge of the surface of the support.

The image receiving layer 33 preferably comprises a polymer which exhibits a softening temperature of lower than 80° C. as determined by the Vicat process to receive the toner layer. Further, the image receiving layer 33 may optionally comprise a photopolymerizable material as disclosed in JP-A-59-97140 to obtain a proper releasability for the transfer to printing paper.

The photopolymerizable image receiving layer suitable for the present invention comprises (iv) at least one multifunctional vinyl or vinylidene compound capable of undergoing addition polymerization to produce a photopolymer, (v) an organic polymer binder, and (vi) a photopolymerization initiator, and optionally additives such as a thermal polymerization inhibitor. Preferred examples of the vinyl or vinylidene compounds (iv) which can be used in the present invention include the same compounds as the photopolymerizable monomers incorporated in the light-sensitive layer 13 of the present invention. Examples of the organic polymer binder (v) include the polymers incorporated in the binder for the light-sensitive layer 13.

The photopolymerization initiator needs to be a compound which exhibits absorption and activity in the near ultraviolet range and little or no absorption in the visible light range. Examples of such photopolymerization initiators include aromatic ketones such as benzopheone, Michler's ketone, 4,4'-bis(dimethylamino)benzophenone, 4-methoxy-4'-dimethylaminobenzophenone, 2-ethylanthraquinone, and phenonethraquinone, benzoin ethers such as benzoin, benzoin methyl ether, benzoin ethyl ether and benzoin phenyl ether, benzoins such as methyl benzoin and ethyl benzoin, dimers such as 2-(o-chlorophenyl)-4,5-diphenylimidazole dimer and 2-(o-chlorophenyl)-4,5-(m-methoxyphenyl)imidazole dimer, and other photopolymerization initiators described with reference to the light-sensitive layer 13 of the present invention.

The amount of the photopolymerization initiator to be added is preferably in the range of about 0.01 to 30% by weight based on the weight of photopolymerizable monomer compound. The proper mixing ratio of photopolymerizable monomer to organic polymer binder depends on the combination of monomer compound and binder to be used but is normally in the range of about 0.1:1.0 to about 2.0:1.0 by weight. The amount of the photopolymerization initiator to be added is preferably in the range of about 0.01 to 20% by weight based on the weight of monomer compound.

The thickness of the image receiving layer needs to vary to receive four color images formed. The image receiving layer may have at least a thickness enough for this purpose. The proper amount of the photopolymerizable substance to be coated depends on the thickness of the color image but is preferably in the range of about 2 g/m$^2$ to 50 g/m$^2$ or about 1 to 50 μm.

The image receiving layer 33 of the present invention may be in a two-layer structure, though not so shown in FIG. 3. In particular, a process for transferring an image to a permanent support such as printing paper which comprises transferring the upper one of the two layers with an image to leave the lower layer (the layer on the support side) is described in detail in JP-A-61-189535, JP-A-2-244146, JP-A-2-244147, and JP-A-2-244148. The process described in these publications is preferable in the light of approximation to printed matter and other respects and can be preferably used in association with the image receiving element of the present invention.

The procedure for carrying out a color proof in the surprint process by laser recording will be described in order below.

1) Laser beams which have been modulated by a color separation image signal are converged into a beam having a proper diameter and scanned on the light-sensitive layer. The laser beam can be incident upon the light-sensitive layer from either the support side or the cover film side. In order to scan the laser beam, the laser beam is moved (subscanned) synchronously with the signal in the direction perpendicular to the primary scanning direction while the light-sensitive element is rotated on a rotary drum at a high speed (drum scanning process) or the laser beam is scanned at a high speed over the light-sensitive element on a planar stage while the light-sensitive element is moved (sub-scanned) in the direction perpendicular to the primary scanning direction (planar scanning process). In the present invention, either of the two scanning processes or a modified version thereof can be used.

2) A toner layer having a hue corresponding to the color separation image is superimposed upon the light-sensitive layer on which the laser recording has been made. The laminate is then passed through a laminator under pressure and optionally heating. As a result, the toner layer is transferred to the unexposed light-sensitive layer in response to the imagewise exposed pattern, and then developed.

3) Separation images having second, third and optionally fourth hues, respectively, are sequentially laser-recorded on separate light-sensitive elements. Toner elements having the corresponding hues are transferred to these light-sensitive elements, respectively, and then developed. The conditions under which the separation images having the first to fourth hues are developed are preferably predetermined to be the same to minimize errors in working and thus enhance the processing efficiency.

4) The toner element having the first hue is superimposed on an image receiving element in such a manner that the image on the toner element is brought into contact with the image receiving layer on the image receiving element. The laminate is then passed through a laminator under heat and pressure. As a result, the separation image is firmly glued to and transferred to the image receiving layer.

5) Separation images having second, third and optionally fourth hues are registered with the image having the first hue and then similarly transferred. The toner layer for the second separation image is transferred directly to the image receiving layer or firmly glued to the toner layer for the first separation image and then transferred to the image receiving layer when passed through the laminator under heating and pressure. Similarly, the third separation image is glued to either the first toner layer or the second toner layer, and then transferred to the image receiving layer. The conditions under which the separation images having the first to fourth hues are transferred to the image receiving element are preferably predetermined to be the same to minimize errors in working and thus enhance the processing efficiency.

Figure 4:
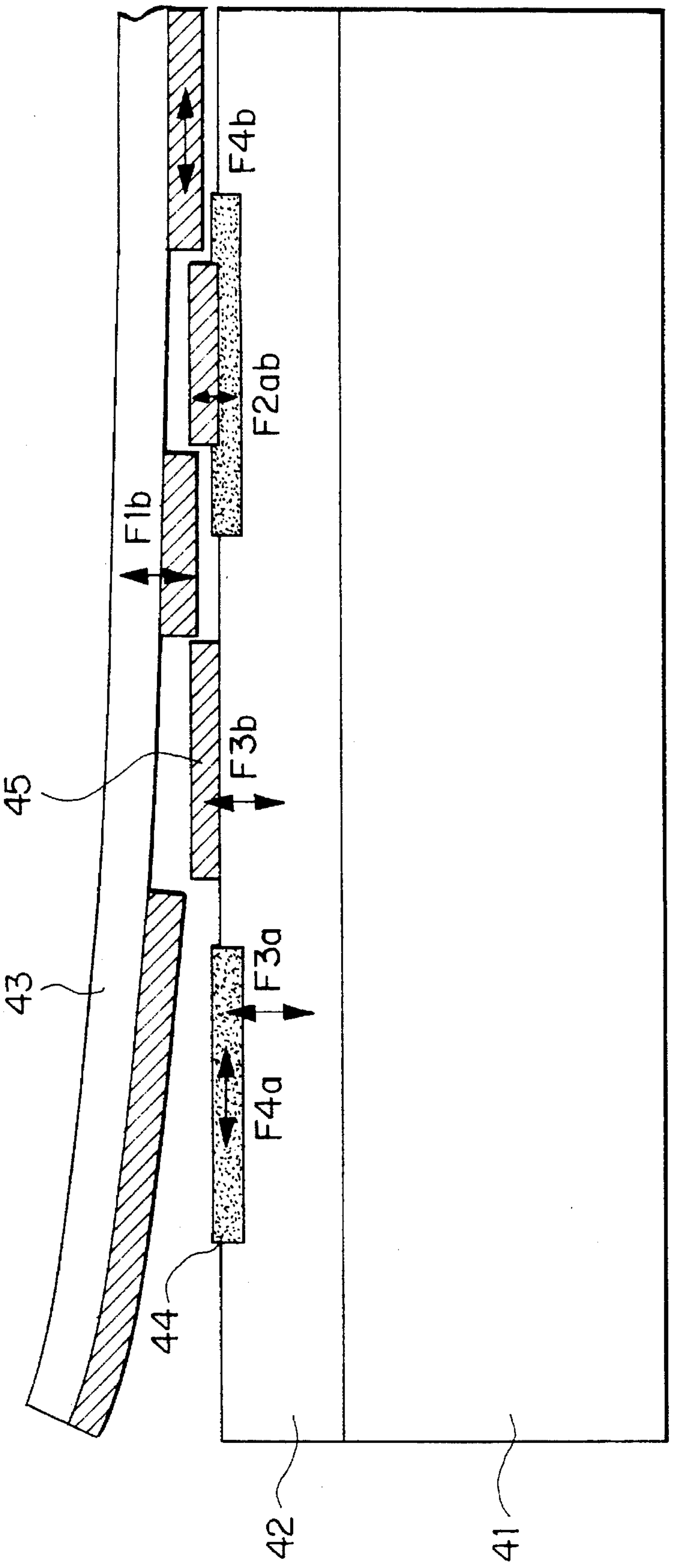
FIG. 4 is a sectional view diagramatically illustrating the section of an embodiment of the arrangement in which a second toner image is transferred to an image receiving element after a first toner image has been transferred to the image receiving element in the image formation process of the present invention.

FIG. 4 illustrates how the second separation image is transferred to the image receiving element after the transfer of the first toner image. Shown at 41, 42, 43, 44 and 45 are a support for the image receiving element, an image receiving layer, a support for the toner element, a first separation image (hue a) and a second separation image (hue b), respectively. F1b is the adhesion between the second separation image (toner layer having a hue b) and the support 43. F2ab is the adhesion between the toner layer for the first separation image and the toner layer for the second separation image. F3a is the adhesion between the first separation image and the image receiving layer. F3b is the adhesion between the second separation image and the image receiving layer. F4a is the cohesive power of the first separation image layer. F4b is the cohesive power of the second separation image layer. Since F1b is smaller than F2ab, F3a, F3b, F4a and F4b, the second separation image can be transferred to the image receiving element without providing other layers such as adhesive layer on the first separation image.

In the present invention, the addition of a plasticizer to the toner layer reduces F1b while increasing the adhesion between the toner layers a and b, thus satisfying the above mentioned relationships of force.

6) The image receiving layer on which four color separation images have been transferred is superimposed on a white paper. The laminate is then passed through a heating laminator under heating and pressure so that the image receiving layer is glued to the white paper.

7) If the image receiving layer is photopolymerizable, it is entirely irradiated with ultraviolet rays through a transparent support in the image receiving element so that the image receiving layer is photo-set.

8) The transparent support is peeled off the material to obtain a transferred four-color registered image.

The first laser recording step is effected with light beam emitted from a gas laser such as an argon ion laser, a helium neon laser or a helium cadmium laser, a solid laser such as a YAG laser, a semidonductor laser, a dye laser or an eximer laser or a light beam obtained by passing such a laser light beam through a secondary harmonic element so that the wavelength thereof is halved. The laser to be used is properly selected from these lasers depending on the wavelength to which the light-sensitive layer is sensitive, the sensitivity of the light-sensitive layer, and the necessary recording speed. The modulation of the laser beam by an image signal can be accomplished by any known method. For example, if an argon ion laser is used, modulation can be carried out by passing the laser beam through an external modulator. If a semiconductor laser is used, modulation can be carried out by controlling electric current supplied to the laser in response to the image signal (direct modulation). Known methods can be used to converge and scan the modulated laser beam over the light-sensitive layer.

In the case where the final image is transferred to a paper, when the laser beam is scanned for recording, it is necessary that scanning and recording be effected in such a manner that the image is reversed with respect to the original image as viewed from the light-sensitive layer (or cover film) side.

In the image formation with the light-sensitive element of the present invention, a toner element on which a toner layer has been left can be directly used without being transferred to the image receiving element. Further, a light-sensitive element to which a toner layer has been transferred can be used.

For example, the toner element on which a toner layer has been left has an excellent image with little defects and thus can be used as a mask for printing on printing plates or the like, that is, as a mask prepared from a so-called lith film.

Figure 5:
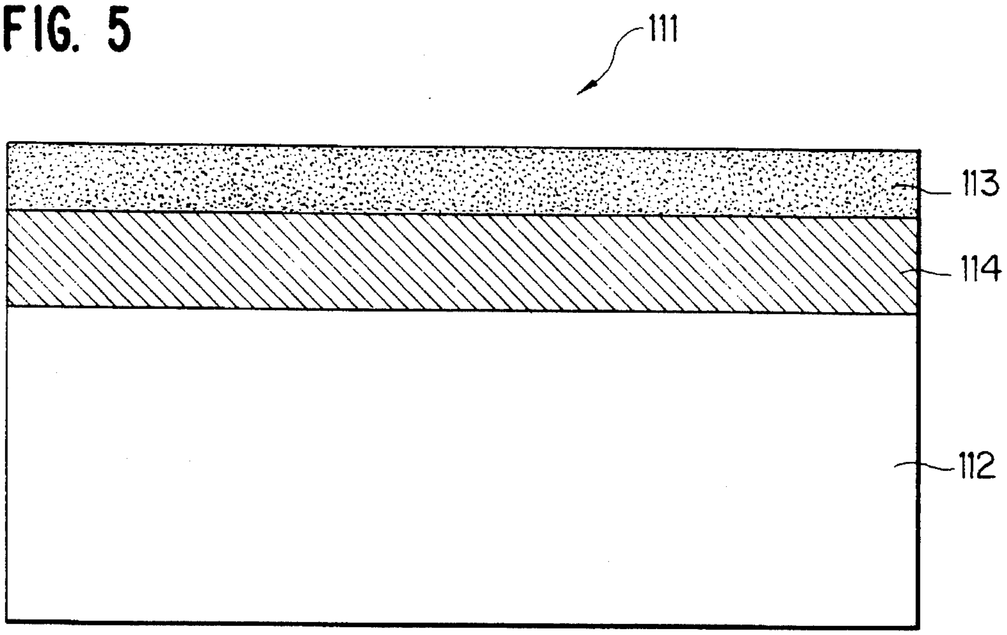
FIG. 5 is a sectional view diagramatically illustrating the section of an embodiment of the light-sensitive element used in the image formation process of the present invention.

FIG. 5 is a sectional view diagramatically illustrating the section of an embodiment of the light-sensitive element used in the present invention. A light-sensitive element 111 comprises a light-sensitive layer 113 provided on a support 112 with a layer 114 having a softening temperature of about 80° C. or lower as determined by the Vicat process (hereinafter referred to as an "interlayer") interposed therebetween.

The support 112 is not specifically limited so long as it is in the form of a film or tablet. The support 112 may be made of any suitable material. Examples of the support material include high molecular compounds as described with reference to the support 12 in FIG. 1.

The support 112 may be subjected to a physical surface treatment such as glow discharge or corona discharge to enhance the adhesion to the interlayer 114.

The support 112 may include a subbing layer provided thereon. The subbing layer material can be properly selected from film-forming polymer materials taking into account the adhesion between the support and the interlayer and, if the interlayer is provided by coating, the solubility in the solvent. The thickness of the subbing layer is not specifically limited but is preferably in the range of about 0.01 to 2 μm.

The interlayer material is preferably selected from high molecular organic materials which exhibit a softening point of about 80° C. or lower as determined by the Vicat process (polymer softening point measurement process by ASTMD-1235 (American Society for Testing and Materials)). Such an interlayer material is preferable because the pressure and/or heat applied upon lamination can deform the unexposed portion of the light-sensitive layer and the interlayer and eleiminate surface roughness caused by foreign matters or the like that otherwise might cause serious defects upon development. The use of such an interlayer material, in effect, improves the adhesion between the light-sensitive layer and the toner layer. A polymer having a high softening point needs to be transferred at a high temperature that may greatly affect the dimensional stability of images.

If a polyethylene terephthalate film or the like is used as a support for the light-sensitive element or the toner element, a high molecular organic material having a softening point of about 80° C. or lower, preferably 60° C. or lower, particularly 50° C. or lower as determined by the Vicat process is selected in this respect.

As a specific example of high molecular organic materials having a softening point of about 80° C. or lower there is preferably selected at least one material from polyolefins such as polyethylene and polypropylene, ethylene copolymers such as ethylene-vinyl acetate ester and ethylene-acrylic acid ester, vinyl chloride copolymers such as polyvinyl chloride and vinyl chloride and vinyl acetate, polyvinylidene chloride and copolymers thereof, styrene copolymers such as polystyrene and styrene-(meth)acrylic acid ester, vinyl toluene copolymers such as polyvinyl toluene and vinyl toluene(meth)acrylic acid ester, ester (meth)acrylate copolymers such as ester poly(meth)acrylate, butyl (meth)acrylate and vinyl acetate, polyamide resins such as acetic acid copolymer nylon, copolymeric nylon and N-alkoxymethylated nylon, polybutadiene, polyisoprene and copolymers thereof (rubber polymers), and chlorinated rubbers. Further, high molecular organic materials having a softening point of about 80° C. or lower as described in "Handbook of Properties of Plastics" (writen by Nihon Plastic Kogyo Renmei, edited by Zennihon Plastic Kogyo Rengokai, published by Kogyo Chosakai, Oct. 25, 1968) can be used. Among these high molecular organic materials, the softening point of some can be substantially lowered by adding thereto certain kinds of plasticizers compatible therewith. Further, even high molecular organic materials having a softening point of 80° C. or higher can have their softening point substantially lowered to lower than 80° C. by adding thereto a plasticizer compatible therewith. These high molecular organic materials can further include various polymers, adhesion improvers, surface active agents or release agents incorporated therein to such an extent that its softening point does not substantially exceed 80° C. to adjust the adhesion to the support or light-sensitive layer.

By way of example, if an ethylene-vinyl acetate copolymer is provided on a polyethylene terephthalate film as an interlayer, the addition of a slight amount of chlorinated polyethylene to the high molecular organic material is particularly effective.

The thickness of the interlayer is not specifically limited so long as the sum of the thickness of the interlayer and the light-sensitive layer is not less than about 8 μm but is preferably in the range of about 3 μm to 100 μm, particularly about 10 μm to 50 μm.

The interlayer can be coated on the support in the form of a solution of the above mentioned polymer in a proper solvent or by forming such a layer on another tentative support by any suitable method such as coating and melt extrusion, and then transferring the layer to the support.

With this interlayer, when the light-sensitive element is transferred to an uneven surface, e.g., an image receiving element on which an image has already been formed by a toner layer, it absorbs the unevenness to bring the surfaces into thorough contact therewith, preventing the deterioration of image quality due to loss of dots.

The same effects can also be obtained by increasing the thickness of the light-sensitive layer. That is, as the thickness of the light-sensitive layer increases from 10 μm, this defect is reduced. When the thickness of the light-sensitive layer reaches about 15 to 20 μm, there is little or no defect. However, since materials useful as the photopolymerization initiator or spectral sensitizer to be incorporated in the light-sensitive layer are normally extremely expensive, the increase in the thickness of the light-sensitive layer causes a drastic rise in the production cost, disadvantageously hindering practical use.

The light-sensitive layer 113 is the same as described with reference to the light-sensitive layer 13 in FIG. 1.

Figure 6:
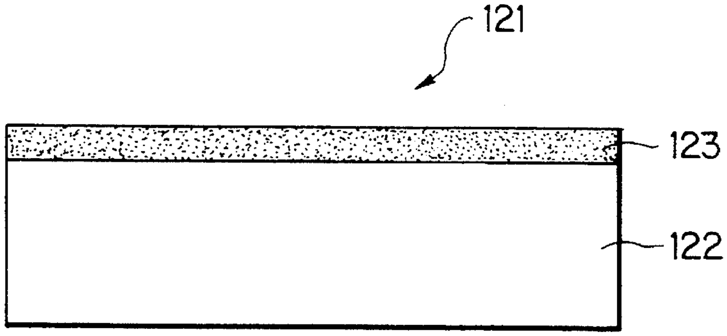
FIG. 6 is a sectional view diagramatically illustrating the section of an embodiment of the toner element used in the image formation process of the present invention.

FIG. 6 is a sectional view diagramatically illustrating the section of an embodiment of the toner element similar to that of FIG. 2 used in the present invention.

In FIG. 6, a toner element 121 comprises a toner layer 123 provided on a support 122.

The toner layer comprises at least one binder to control its film properties and brittleness. The binder is also used to control the rheological properties of the coat as well as to stabilize the pigment in the dispersion system. Typically, the pigment and binder or a part of the binder are crushed in a mill until the desired grain diameter and color are obtained. The paste thus obtained is then diluted-with a solvent or a mixture of solvents to obtain a dispersion having the desired viscosity.

In order to obtain a high image quality when the toner layer is selectively transferred in response to the imagewise exposed and unexposed portions of the light-sensitive layer, both the shear breaking strength and elongation of the toner layer coat to be used in the present invention are preferably small. To this end, the binder suitable for the toner layer is preferably brittle at a temperature of at least the toner development temperature. From this standpoint, the binder, if it is a polymer having a glass transition temperature Tg, preferably has Tg of not lower than at least room temperature.

Other examples of the process for the adhesion of a plurality of toner layers having different hues on an image receiving element include:

1) the use as a binder for the toner layer of a polymer which softens by heat or pressure when laminated to the image receiving element; and
2) the provision as a subbing layer for the toner layer of a layer which is not peeled off the support for the toner layer upon development but is transferred together with the imagewise toner layer to the image receiving layer when the toner layer is transferred to the image receiving layer and serves to adhere toner layers laminated subsequently (release layer).

Figure 7:
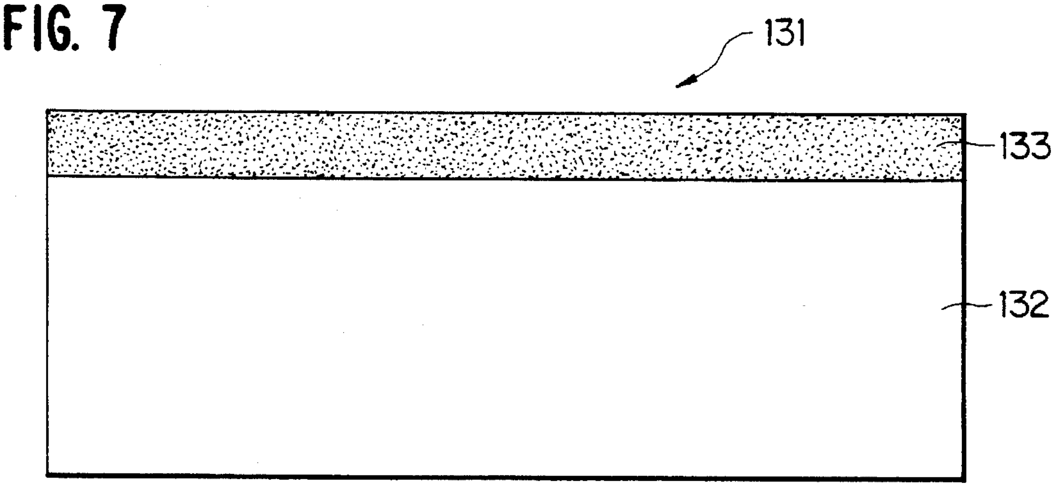
FIG. 7 is a sectional view diagramatically illustrating the section of an embodiment of the image receiving element used in the image formation process of the present invention.

FIG. 7 is a sectional view diagramatically illustrating the section of an embodiment of the image receiving element similar to that of FIG. 3 used in the present invention. In FIG. 7, an image receiving element 131 comprises an image receiving layer 133 provided on a support 132.

The procedure for carrying out color proof in the surprint process by laser recording will be described in order below.

1) Laser beams which have been modulated by a color separation image signal are converged into a beam having a proper diameter and scanned on the light-sensitive layer. The laser beam can be incident upon the light-sensitive layer from either the support side or the cover film side. In order to scan the laser beam, the laser beam is moved (sub-scanned) synchronously with the signal in the direction perpendicular to the primary scanning direction while the light-sensitive element is rotated on a rotary drum at a high speed (drum scanning process) or the laser beam is scanned at a high speed over the light-sensitive element on a planar stage while the light-sensitive element is moved (sub-scanned) in the direction perpendicular to the primary scanning direction (planar scanning process). In the present invention, either of the two scanning processes or a modified version thereof can be used.

2) A toner layer having a hue corresponding to the color separation image is superimposed upon the light-sensitive layer on which laser recording has been made (optionally after the cover film has been removed). The laminate is then passed through a laminator under pressure and optionally heating. As a result, the toner layer is transferred to the unexposed light-sensitive layer in response to the imagewise exposed pattern, and then developed.

3) Separation images having second, third and optionally fourth hues, respectively, are sequentially laser-recorded on separate light-sensitive elements. Toner elements having the corresponding hues are transferred to these light-sensitive elements, respectively, and then developed. The conditions under which the separation images having the first to fourth hues are developed are preferably predetermined to be the same to minimize errors in working and thus enhance the processing efficiency.

In this case, a new light-sensitive layer is necessary for each color toner element. As such light-sensitive layers, separate light-sensitive elements may be used. However, a new light-sensitive layer can be provided by coating or lamination after one color has been transferred using the same light-sensitive element. This is possible because that the interlayer absorbs some uneveness on the surface of the light-sensitive layer, providing a sufficient adhesion.

4) The toner element having the first hue is superimposed on an image receiving element in such a manner that the image on the toner element is brought into contact with the image receiving layer on the image receiving element. The laminate is then passed through a laminator under heat and pressure. As a result, the separation image is firmly glued to and transferred to the image receiving layer.

5) Separation images having second, third and optionally fourth hues are registered with the image having the first hue and then similarly transferred. The toner layer for the second separation image is transferred directly to the image receiving layer or firmly glued to the toner layer for the first separation image and then transferred to the image receiving layer when passed through the laminator under heating and pressure. Similarly, the third separation image is glued to either the first toner layer or the second toner layer, and then transferred to the image receiving layer. The conditions under which the separation images having the first to fourth hues are transferred to the image receiving element are preferably predetermined to be the same to minimize errors in working and thus enhance the processing efficiency.

Figure 8:
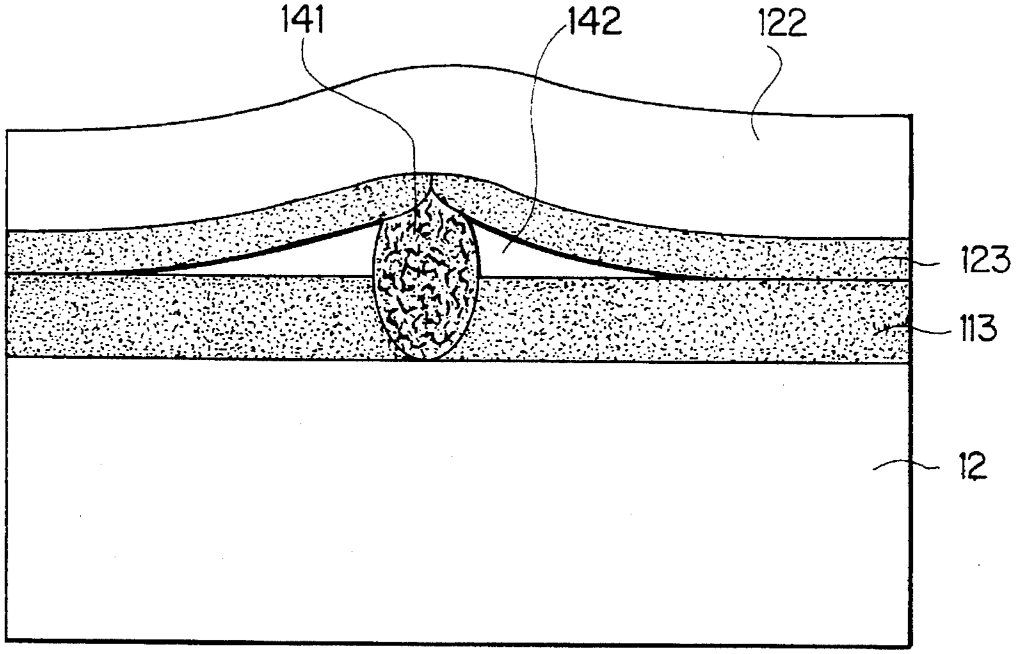
FIG. 8 is a sectional view diagramatically illustrating an embodiment of the arrangement of face-to-face contact with large foreign materials mixed in the system in an image formation process free of the light-sensitive element of the present invention.

FIG. 8 is a sectional view diagramatically illustrating the structure of a laminate of a light-sensitive element having a relatively thin light-sensitive layer free of interlayer with a toner element. Shown at 141 is a foreign matter mixed in the system at any step from the coating of the light-sensitive layer to the lamination with the toner element. Some size of the foreign matter can cause a gap 142 to be formed. This causes the toner on the gap portion to be left on the support for the toner layer instead of being transferred to the light-sensitive layer, resulting in defects.

Figure 9:
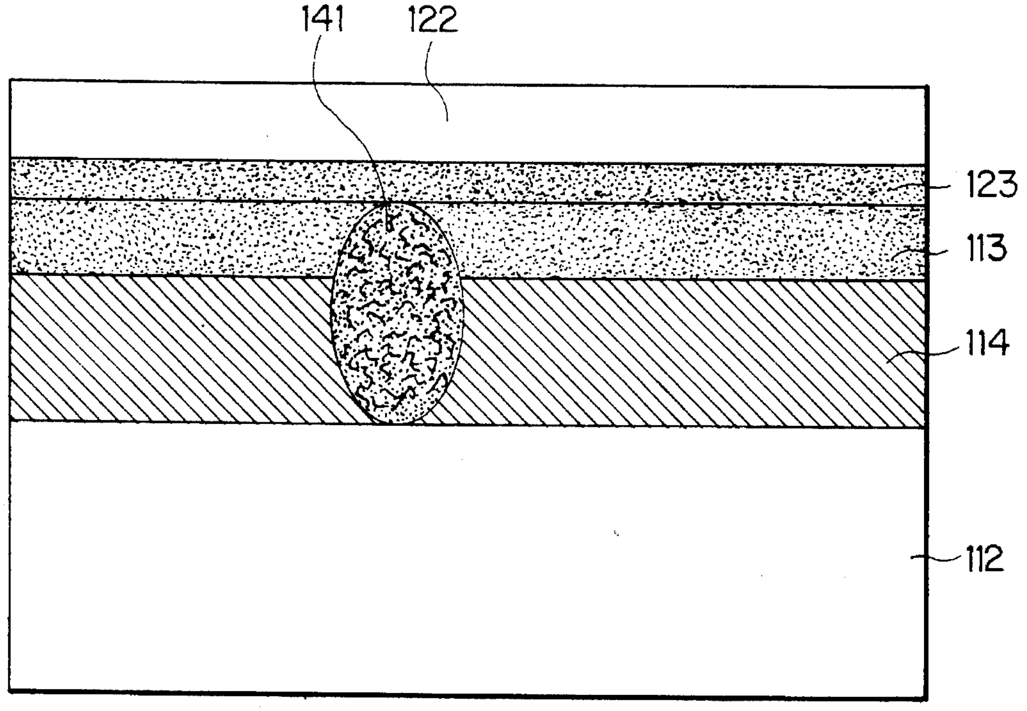
FIG. 9 is a sectional view diagramatically illustrating an embodiment of the arrangement of face-to-face contact with large foreign materials mixed in the system in an image formation process using the light-sensitive element of the present invention.

FIG. 9 is a sectional view diagramatically illustrating the structure of a laminate of a toner layer with a light-sensitive element provided with an interlayer.

A foreign matter 141 sinks in the soft interlayer 114, preventing the formation of gaps between the toner layer and the light-sensitive element. Thus, no image defects are caused.

Figure 10:
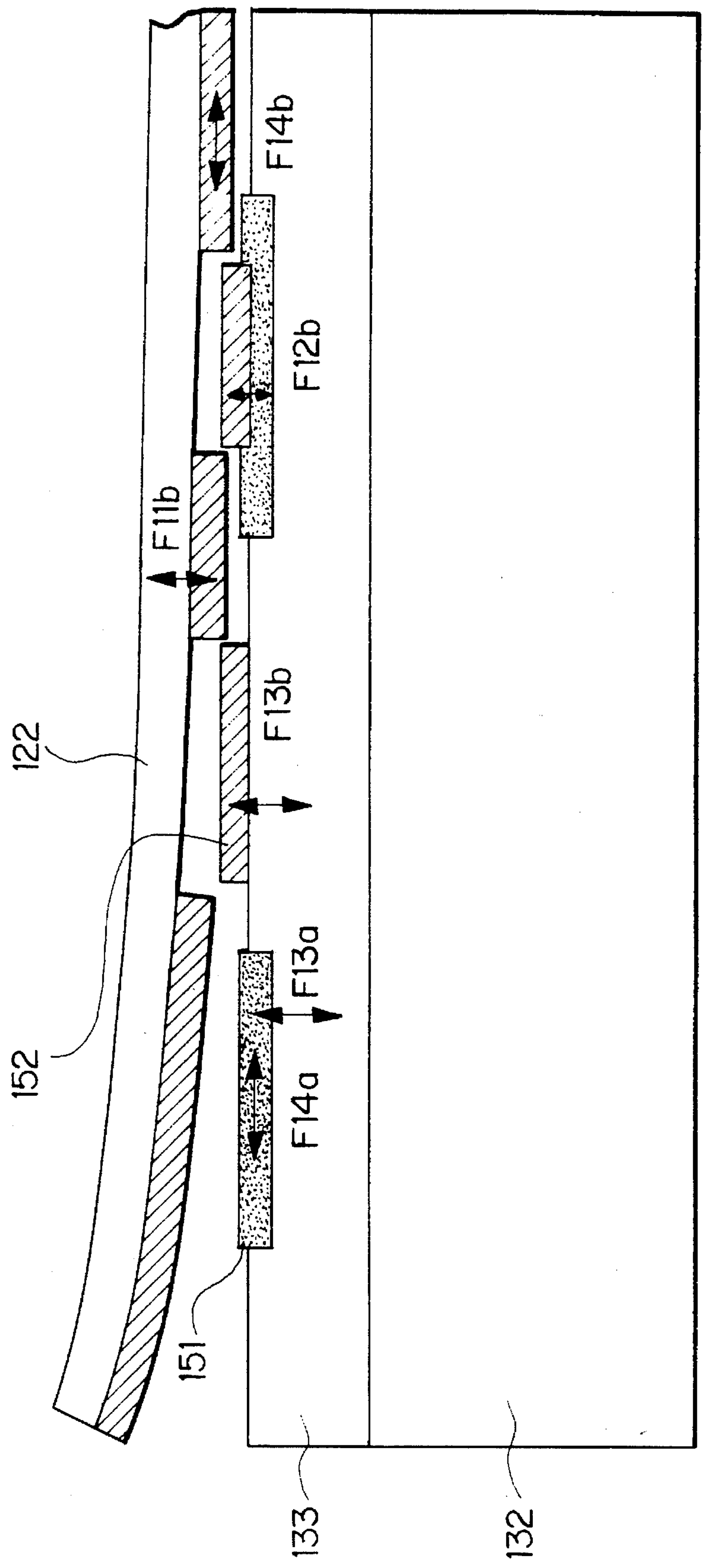
FIG. 10 is a sectional view diagramatically illustrating an embodiment of the arrangement in which a second toner image is transferred to an image receiving element after a first toner image has been transferred to the image receiving element in the image formation process of the present invention.

FIG. 10 illustrates how the second separation image is transferred to the image receiving element after the transfer of the first toner image. Shown at 132, 133, 122, 151 and 152 are a support for the image receiving element, an image receiving layer, a support for the toner element, a first separation image (hue a) and a second separation image (hue b), respectively. **F11*b* is the adhesion between the second separation image (toner layer having a hue b) and the support 122. F12*ab* is the adhesion between the toner layer for the first separation image and the toner layer for the second separation image. F13*a* is the adhesion between the first separation image and the image receiving layer. F13*b* is the adhesion between the second separation image and the image receiving layer. F14*a* is the cohesive power of the first separation image layer. F14*b* is the cohesive power of the second separation image layer. Since F11*b* is smaller than F12*ab*, F13*a*, F13*b*, F14*a* and F14*b***, the second separation image can be transferred to the image receiving element without providing other layers such as an adhesive layer on the first separation image.

In the present invention, the addition of a plasticizer to the toner layer reduces **F11*b*** while increasing the adhesion between the toner layers a and b, thus satisfying the above mentioned relationships of force.

6) The image receiving layer on which four color separation images have been transferred is superimposed on a white paper. The laminate is then passed through a heating laminator under heating and pressure so that the image receiving layer is glued to the white paper.

7) If the image receiving layer is photopolymerizable, it is entirely irradiated with ultraviolet rays through a transparent support in the image receiving element so that the image receiving layer is photo-set.

8) The transparent support is peeled off the material to obtain a transferred four-color registered image.

The first laser recording step is effected with light beam emitted from a gas laser such as an argon ion laser, a helium neon laser or a helium cadmium laser, a solid laser such as a YAG laser, a semiconductor laser, a dye laser or an eximer laser or a light beam obtained by passing such a light beam through a secondary harmonic element so that the wavelength thereof is halved. The laser to be used is properly selected from these lasers depending on the wavelength to which the light-sensitive layer is sensitive, the sensitivity of the light-sensitive layer, and the necessary recording speed. The modulation of the laser beam by an image signal can be accomplished by any known method. For example, if an argon ion laser is used, modulation can be carried out by passing the laser beam through an external modulator. If a semiconductor laser is used, modulation can be carried out by controlling the electric current supplied to the laser in response to the image signal (direct modulation). Known methods can be used to converge and scan the modulated laser beam over the light-sensitive layer.

In the case where the final image is transferred to a paper, when the laser beam is scanned for recording, it is necessary that scanning and recording be effected in such a manner that the image is reversed with respect to the original image as viewed from the light-sensitive layer (or cover film) side.

The present invention will be further described in the following examples, but the present invention should not be construed as being limited thereto.

EXAMPLE 1

A coating solution for a light-sensitive layer having the following formulation was prepared. Photopolymerization initiators A and B were used in the form of chloroform solutions (0.45 g/ml).

| | |
|---|---|
| Binder (80:20 (molar ratio) allyl methacrylate-methacrylic acid copolymer; molecular weight: 360,000) | 4.0 parts by weight |
| Polyvinyl pyrrolidone (type K-15 produced by Gokyo Sangyo K.K.; molecular weight: 10,000) | 5.0 parts by weight |
| Dipentaerythritol hexaacrylate (photopolymerizable monomer; abbreviation: DPHA) | 1.2 parts by weight |
| Photopolymerization initiator A (structural formula A) | 0.045 parts by weight (solid content) |
| Structural formula A | |
| 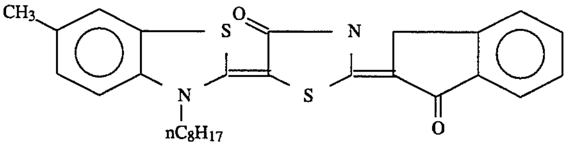 | |
| Photopolymerization initiator B (structural formula B) | 0.045 parts by weight (solid content) |
| Structural formula B | |
| 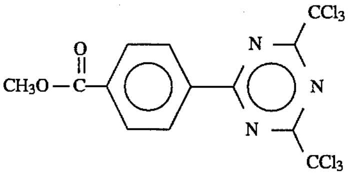 | |
| Hydroquinone monomethyl ether (thermal polymerization inhibitor) | 0.01 parts by weight |
| 1-Methoxy-2-propanol | 21 parts by weight |

The above described coating solution was coated onto a 100-μm thick polyethylene terephthalate (PET) film as a support by means of a rotary coater (whirler) at 100 rpm for 1 minute. The material was then dried at a temperature of 100° C. in an oven for 2 minutes. The resulting light-sensitive layer had a thickness of 2 μm. The light-sensitive layer was then laminated with a 12-μm thick polypropylene film by means of a laminator to prepare a light-sensitive element.

Toner layer coating solutions having the following formulations were then prepared.

| <Black toner coating solution: abbreviated as K1> | |
|---|---|
| Coloring material (Microlithblack C-A produced by Ciba Geigy K.K. (see Note 1)) | 4.5 parts by weight |
| Additive (pentaerythritol tetraacrylate: abbreviated as PET-4A) | 0.18 parts by weight |
| Solvent (methyl ethyl ketone) | 200 parts by weight |
| Solvent (propylene glycol monoethyl ether acetate) | 100 parts by weight |

-continued

| <Cyan toner coating solution: abbreviated as C1> | |
|---|---|
| Coloring material (pigment dispersion C1 (see Note 2)) | 10.8 parts by weight |
| Additive (dioctyl phthalate) | 0.6 parts by |

-continued

| | |
|---|---|
| | weight |
| Solvent (n-propanol) | 76 parts by weight |
| Solvent (cyclohexanol) | 2 parts by weight |
| Solvent (acetone) | 7 parts by weight |
| **<Magenta toner coating solution: abbreviated as M1>** | |
| Coloring material (pigment dispersion M1 (see Note 3)) | 7.2 parts by weight |
| Additive (CRP (structural formula C)) Structural formula C (CRP) $O{=}P[-OCH(CH_2Cl)_2]_3$ | 0.6 parts by weight |
| Solvent (methyl ethyl ketone) | 80 parts by weight |
| Solvent (propylene glycol monomethyl ether acetate) | 40 parts by weight |
| **<Yellow toner coating solution: abbreviated as Y1>** | |
| Coloring material (Microlithyellow 2R-A produced by Ciba Geigy K.K. (see Note 4)) | 1.8 parts by weight |
| Additive (PET-4A) | 0.8 parts by weight |
| Solvent (methyl ethyl ketone) | 60 parts by |

-continued

| | |
|---|---|
| | weight |
| Solvent (propylene glycol monomethyl ether acetate) | 60 parts by weight |

(Note 1)
Processed pigment made of Microlithblack C-A (carbon black pigment) and ethyl cellulose (binder)

(Note 2)
Pigment dispersion having the following formulation:

| | |
|---|---|
| Pigment (No-700-10 FG Cyanine Blue produced by Toyo Ink Mfg. Co., Ltd.) | 10 parts by weight |
| Binder (50:35:15 by molbenzyl methacryl-atemethacrylic acid-acrylic acid copolymer; molecular weight: 60,000) | 15 parts by weight |
| Solvent (methyl ethyl ketone) | 31 parts by weight |
| Solvent (methyl cellosolve acetate) | 26 parts by weight |
| Solvent (methoxy propanol) | 17 parts by weight |

(Note 3)
Pigment dispersion having the following formulation:

| | |
|---|---|
| Pigment (Lionol red LX-235 produced by Toyo Ink Mfg. Co., Ltd.) | 12 parts by weight |
| Binder (67:33(by mol)benzyl methacrylate-methacrylic acid copolymer; molecular weight: 43,000) | 18 parts by weight |
| Solvent (methyl cellosolve acetate) | 37 parts by weight |
| Solvent (methyl propyl acetate) | 33 parts by weight |

(Note 4)
Processed pigment made of Microlithyellow 2R-A (Pigment yellow 83; C.I. 21108) and ethyl cellulose (binder)

Each of the above described toner coating solutions was coated onto a 75-μm thick polyethylene terephthalate (PET) films as supports by means of a rotary coater (whirler) at 120 rpm for 1 minute. The coat materials were each then dried at a temperature of 100° C. in an oven for 2 minutes to prepare toner elements having various hues. These toner layers had a thickness of 0.2 μm (black), 0.4 μm (cyan), 0.4 μm (magenta) and 0.2 μm (yellow), respectively.

Image receiving layer coating solutions having the following formulations were then prepared.

| | |
|---|---|
| <1st image receiving layer> | |
| Polyvinyl chloride (Zeon 25 produced by Nihon Zeon K.K.) | 9 parts by weight |
| Surface active agent (Megafac F-177P produced by Dainippon Ink And Chemicals, Incorporated) | 0.1 parts by weight |
| Methyl ethyl ketone | 130 parts by weight |
| Toluene | 35 parts by weight |
| Cyclohexanone | 20 parts by weight |
| Dimethyl formamide | 20 parts by weight |
| <2nd image receiving layer> | |
| Methyl methacrylate/ethyl acrylate/methacrylic acid copolymer (Dianal BR-77 produced by Mitsubishi Rayon Company Limited) | 17 parts by weight |
| Alkyl acrylate/alkyl methacrylate copolymer (Dianal BR-64 produced by Mitsubishi Rayon Company Limited) | 17 parts by weight |
| Pentaerythritol tetraacrylate (A-TMMT produced by Shinnakamura Kagaku K.K.) | 22 parts by weight |

-continued

| | |
|---|---|
| Surface active agent (Megafac F-177P produced by Dainippon Ink And Chemicals, Incorporated) | 0.4 parts by weight |
| Methyl ethyl ketone | 100 parts by weight |
| Hydroquinone monomethyl ether | 0.05 parts by weight |
| 2,2-Dimethoxy-2-phenylacetophenone (photopolymerization initiator) | 1.5 parts by weight |

Onto a 100-μm thick polyethylene terephthalate (PET) film as a support was coated the above described 1st image receiving layer coating solution by means of a rotary coater (whirler). The coat material was then dried at a temperature of 100° C. in an oven for 2 minutes. The resulting 1st image receiving layer had a thickness of 1 μm.

Onto the 1st image receiving layer was then coated the 2nd image receiving layer coating solution in the same manner as used above to form a 2nd image receiving layer having a thickness of 26 μm. Thus, an image receiving element was obtained.

Using the light-sensitive element, toner element and image receiving element thus obtained, an image was formed for evaluation in the following manner:

The light-sensitive element was mounted on a rotary drum in such an arrangement that a laser bean could be incident upon the cover film. While the rotary drum was being rotated at a linear speed of 14 m/sec., a laser beam from an argon ion laser (wavelength: 488 nm) was scanned for exposure under the conditions of 1.5 mW for power on specimen and 10 μm for beam diameter. The laser scanning was effected such that the recorded pattern was a line pattern with a pitch of 20 μm. After the cover film was peeled off the light-sensitive element, the light-sensitive element was laminated with the black toner layer. The laminate was then passed through a laminator at a temperature of 100° C. under a pressure of 4.5 $kg/cm^2$ at a rate of 450 mm/min. After being allowed to cool to room temperature, the toner element was peeled off the light-sensitive element to form a toner image on the support for the toner layer. The toner element was then laminated with the image receiving element in such an arrangement that the toner image was brought into contact with the image receiving layer. The laminate was then passed through a laminator at a temperature of 125° C. under a pressure of 4.5 $kg/cm^2$ at a rate of 900 mm/min. After being allowed to cool to room temperature, the image receiving element and the toner element were peeled off each other. As a result, the image which had been on the support for the toner layer was confirmed to have been transferred to the image receiving element.

With the magenta toner element, laser recording and development were effected in the same manner as effected above. The magenta toner element thus obtained was then laminated with the image receiving layer on which the black toner image had been transferred in such an arrangement that the recorded lines crossed each other. The lamination and transfer were effected in the same manner as effected above. It was then confirmed that black lines and magenta lines had been favorably transferred perpendicular to each other.

The same procedure was repeated for laser irradiation, development and transfer with the cyan toner and yellow toner. As a result, a four-color toner layer pattern was formed on the image receiving element.

The image receiving layer on which the four-color toner layers had been transferred was then laminated with an art paper for use in printing. The lamination was effected at a temperature of 125° C., a pressure of 4.5 kg/cm$^2$ and a rate of 450 mm/min. The laminate was then entirely irradiated on the image receiving element side with light from a 2-kW ultrahigh pressure mercury vapor lamp disposed at a distance of 50 cm therefrom. The image receiving element was then peeled off the material. It was then confirmed that the four-color toner image layers had been transferred to the art paper while favorably glued to each other. The image thus obtained exhibited an excellent resolving power and no hue change.

EXAMPLE 2

A light-sensitive layer coating solution having the following formulation was prepared.

| | |
|---|---|
| Binder (33% methyl cellosolve acetate solution of 67:33 (by mol) benzyl methacrylate-methacrylic acid copolymer) | 45.5 parts by weight |
| Photopolymerizable monomer: | |
| Tetraethylene glycol diacrylate | 3.0 parts by weight |
| Pentaerythritol tetraacrylate | 5.0 parts by weight |
| Initiator D (structural formula D) | 0.6 parts by weight |
| Structural formula D | |
| 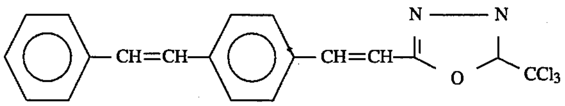 | |
| Surface active agent (Florad FC-430 produced by Sumitomo 3M) | 0.1 parts by weight |
| Methyl ethyl ketone | 110 parts by weight |
| Propylene glycol monomethyl ether acetate | 55 parts by weight |

Using this coating solution, a light-sensitive element was prepared in the same manner as in Example 1. The resulting light-sensitive layer had a thickness of 2.0 μm. Besides the light-sensitive element, a toner film and an image receiving element were prepared in the same manner as in Example 1.

The light-sensitive element was then irradiated with ultraviolet rays from a 2-kW ultrahigh pressure mercury vapor lamp through a four color separation image mask. Using toner films having the corresponding hues, development was effected in the same manner as in Example 1. With the four colors in registration, the image formed on the toner element was then transferred to the image receiving element under the same conditions as used in Example 1. The image was then transferred to an art paper. The image thus obtained exhibited 2 to 98% halftone dots per 150 lines and an excellent scuff resistance.

COMPARATIVE EXAMPLES 1–2

A toner image was formed and then transferred to an image receiving element and then to an art paper in the same manner as in Examples 1 and 2 except that the plasticizer was excluded from the coating solution for each color toner of Example 1. The first color image was favorably transferred to the image receiving layer. However, the second and following color images were insufficiently transferred and their image qualities were not fit for use.

EXAMPLES 3*a*–3*d*, COMPARATIVE EXAMPLE 3

As a magenta toner layer coating solution, a dispersion having the following formulation was prepared.

| | |
|---|---|
| Coloring material (pigment dispersion M1 (see Note 3)(in Example 1)) | 7.2 parts by weight |
| Additive (plasticizer; PET-4A) (amount varied from 0 to 40% by weight based on the total weight of pigment and binder, providing additives a to e) | 0 to 0.6 parts by weight |
| Solvent (methyl ethyl ketone) | 80 parts by weight |
| Solvent (propylene glycol monomethyl ether acetate) | 40 parts by weight |

Using this coating solution, a magenta toner element having a different amount of a plasticizer from Example 1 was prepared in the same manner as in Example 1.

A light-sensitive element, black and yellow toner elements, and an image receiving element were prepared in the same manner as in Example 1. Then, the black and yellow toner layers were subsequently trasferred to the image receiving element in the same manner as in Example 1. Onto the yellow image were then transferred the toner films a to e with the laminator temperature varied. The laminating temperature at which the toner films could be successfully transferred to the image receiving element are set forth in Table 1.

TABLE 1

| Specimen | Added amount of plasticizer (wt %) | Transferable temperature (°C.) |
|---|---|---|
| a (Example 3a) | 10 | 120 |
| b (Example 3b) | 20 | 100 |
| c (Example 3c) | 30 | 80 |
| d (Example 3d) | 40 | 70 |
| e (Comparative Example 3) | 0 | Nontransferable at 150° C. (deformed to image receiving layer support) |

EXAMPLES 4f–4h, COMPARATIVE EXAMPLE 4

Light-sensitive layers, toner elements and image receiving elements were prepared in the same manner as in Example 1 except that as the plasticizer to be incorporated in the cyan toner layer coating solution of Example 1 there was used a compound of the structural formula E (Type MP-14 produced by Daihachi Kagaku K. K.) in different amounts to prepare Specimens f to i.

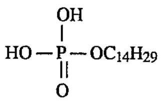

A transfer test was made on the image receiving element after the black image was transferred to the image receiving layer in the same manner as in Example 2. The results are set forth in Table 2.

Table 2 shows that the more MP-14 was added, the better was the transferability as well as the image quality. However, it is also shown that when MP-14 was added in too large an amount, the cohesive failure of the toner layer occurred upon development, deteriorating the image quality.

Structural formula F (CDP)

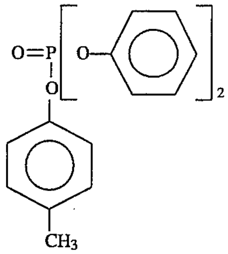

Structural formula G (BDP)

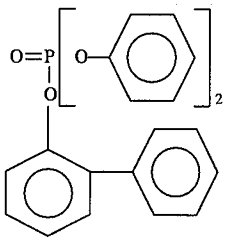

EXAMPLE 6, COMPARATIVE EXAMPLE 6

Specimens were prepared in the same manner as in Example 2 except that the DOP to be used as a plasticizer for the cyan layer was replaced by MP-10 (plasticizer (structural formula H) produced by Daihachi Kagaku K. K.) and MP-16 (plasticizer (structural formula I) produced by Daihachi Kagaku K. K.), respectively. Images were transferred after the black image was transferred to the image receiving layer for evaluation. In the case where no plasticizer was used (Comparative Example 6), all the specimens showed a poor image quality on the printing paper. On the other hand, the specimens comprising these plasticizers incorporated therein (Example 6) exhibited excellent image quality and hue.

TABLE 2

| Specimen | Added amount of plasticizer (wt % based on the total amount of pigment and monomer) | Transferability to image receiving element | Image quality |
|---|---|---|---|
| f (Example 4f) | 12 | Excellent | Almost excellent |
| g (Example 4g) | 24 | Excellent | Excellent |
| h (Example 4h) | 100 | Fair | Slightly poor on nonimage portion (cohesive failure of toner layer) |
| i (Comparative Example 4) | 0 | Poor | Poor on shadow portion |

EXAMPLE 5, COMPARATIVE EXAMPLE 5

Specimens were prepared in the same manner as in Example 2 except that the CRP to be used as a plasticizer for the magenta layer was replaced by DOP, TPP, CDP (structural formula F), and BDP (structural formula G), respectively. Images were transferred after the cyan image was transferred to the image receiving layer for evaluation. In the case where no plasticizer was used (Comparative Example 5), all the specimens showed a poor image quality on the printing paper. On the other hand, the specimens comprising these plasticizers incorporated therein (Example 5) exhibited excellent image quality and hue.

Structural formula H (MP-10)

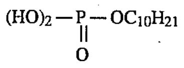

Structural formula I (MP-16)

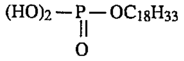

EXAMPLE 7, COMPARATIVE EXAMPLE 7

Light-sensitive layers, toner elements and image receiving elements were prepared in the same manner as in Example 2 except that as the plasticizer to be incorporated in the cyan toner layer coating solution of Example 2 there was used PET-4A in different amounts to prepare Specimens j to n.

A transfer test was effected on the image receiving element after the black image was transferred to the image reveiving layer in the same manner as effected in Example 2. Further, a pressure-sensitive adhesive tape was laminated on the cyan toner layer. The adhesion F1 between the support for the toner element and the toner layer was then measured by means of a tensile tester (tensilon). The results are set forth in Table 3.

Table 3 shows that the addition of a plasticizer allowed the transfer to the image receiving element. It is also shown that as the added amount of the plasticizer increases, the laminating temperature required for transfer lowers. It can thus be seen that one of the factors for improving the transferability is the drop in the adhesion F1 between the toner layer and the support.

TABLE 3

| Specimen | j | k | l | m | n |
|---|---|---|---|---|---|
| Added amount of PET-4A (Note 5) | 0 (Comparative) | 10 (Example) | 20 (Example) | 30 (Example) | 40 (Example) |
| Four-color transferable temperature (°C.) (Note 6) | Nontransferable at 135° C. | Nontransferable at 135° C. | 130 | 120 | 100 |
| Peel force Fl (g/cm) | 170 | 160 | 155 | 90 | 30 |

(Note 5) Wt % based on the total weight of pigment and binder
(Note 6) Black, cyan, magenta and yellow transferred to the image receiving element in this order

EXAMPLE 8

A coating solution for an interlayer having the following formulation was prepared.

| | |
|---|---|
| Polymer (ethylene-ethyl acrylate copolymer; Evaflex A-709 produced by Mitsui Petrochemical Industries, Ltd.) | 20 parts by weight |
| Solvent | 100 parts by weight |

Onto a 100-μm thick polyethylene terephthalate (PET) film as a support was coated the above mentioned coating solution by means of a rotary coater at 200 rpm for 1 minute. The material was then dried at a temperature of 100° C. in an oven for 2 minutes. The resulting interlayer had a thickness of 20 μm.

Onto the interlayer was coated a coating solution for a light-sensitive layer having the following formulation. The material was then dried at a temperature of 100° C. in an oven for 2 minutes. The resulting light-sensitive layer had a thickness of 2 μm. The photopolymerization initiators A' and B were used in the form of solutions (0.45 g/ml).

The light-sensitive layer was then laminated with a 12-μm thick polypropylene film by means of a laminator to prepare a light-sensitive element.

Structural Formula A'

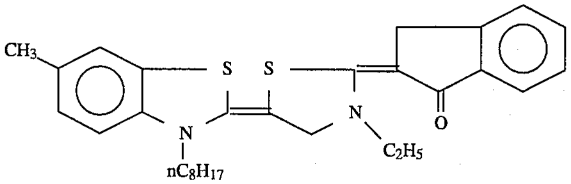

<Coating solution for light-sensitive layer>

| | |
|---|---|
| Binder (80:20 (molar ratio) allyl methacrylate-methacrylic acid copolymer; Molecular weight: 360,000) | 4.0 parts by weight |
| Polyvinyl pyrrolidone (Type K-15 produced by Gokyo Sangyo K.K.; molecular weight: 10,000) | 5.0 parts by weight |
| Dipentaerythritol hexaacrylic (photopolymerizable monomer; abbreviation: DPHA) | 1.2 parts by weight |
| Photopolymerization initiator A (structural formula A' shown above) (solid content) | 0.045 parts by weight |
| Photopolymerization initiator B (structural formula B shown in Example 1) (solid content) | 0.045 parts by weight |
| Hydroquinone monomethyl ether (thermal polymerization inhibitor) | 0.01 parts by weight |
| 1-Methoxy-2-propanol | 21 parts by weight |

A black toner layer coating solution having the following formulation was then prepared.

<Black toner coating solution: abbreviated as K1>

| | |
|---|---|
| Coloring material (Microlithblack C-A produced by Ciba Geigy K.K. (see Note 1 below)) | 4.5 parts by weight |
| Additive (pentaerythritol tetraacrylate: abbreviated as PET-4A) | 0.18 parts by weight |
| Solvent (methyl ethyl ketone) | 200 parts by weight |
| Solvent (propylene glycol monoethyl ether acetate) | 100 parts by weight |
| Surface active agent (Megafac F-176P produced by Dainippon Ink And Chemicals, Incorporated) | 0.5 parts by weight |

(Note 1)

Processed pigment made of Microlithblack C-A as a carbon black and ethyl cellulose as a binder.

Onto a 75-μm thick polyethylene terephthalate (PET) film as a support was coated the above mentioned coating solution by means of a rotary coater (whirler) at 120 rpm for 1 minute. The material was then dried at a temperature of 100° C. for 2 minutes to prepare a black toner element. The resulting toner layer had a thickness of 0.2 μm.

Using the light-sensitive element and toner element thus obtained, an image was formed for evaluation in the following manner:

The light-sensitive element was mounted on a rotary drum in such an arrangement that a laser beam could be incident upon the cover film. While the rotary drum was being rotated at a linear speed of 14 m/sec., a laser beam from an argon ion laser (wavelength: 488 nm) was scanned for exposure under the conditions of 1.5 mW for power on specimen and 10 μm for beam diameter. The laser scanning was effected such that the recorded pattern was a line pattern with a pitch of 20 μm. After the cover film was peeled off the light-sensitive element, the light-sensitive element was laminated with the black toner layer. The laminate was then passed through a laminator at a temperature of 100° C. under a pressure of 4.5 $kg/cm^2$ at a rate of 450 mm/min. After being allowed to cool to room temperature, the toner element was peeled off the light-sensitive element to form a toner image on the light-sensitive layer and the support for the toner layer.

The images thus obtained exhibited an excellent sensitivity. All these images exhibited an excellent defition and very little visually observable defects.

COMPARATIVE EXAMPLE 8

Using a light-sensitive element and a toner element prepared in the same manner as in Example 1 except that no interlayer was provided, image formation and evaluation were effected in the same manner as in Example 1.

As a result, there were observed white clear dots having a size of scores of micrometers to hundreds of micrometers caused by poor adhesion due to foreign matters on the toner layer and a toner layer left corresponding thereto on the toner element, showing a great drop in the image quality.

Most of the defects were observed to have foreign matters in the central portion thereof under a microscope.

EXAMPLE 9

Coating solutions for cyan, magenta and yellow toner layers having the following formulations were prepared.

<Cyan toner coating solution: abbreviated as C1>

| | |
|---|---|
| Coloring material (pigment dispersion C1)(see Note 2 below) | 10.8 parts by weight |
| (Note 2) | |
| C1: Pigment dispersion having the following formulation: | |
| Pigment (No-700-10 FG Cyanine Blue | 10 parts by |

-continued

| | |
|---|---|
| produced by Toyo Ink Mfg. Co., Ltd.) | weight |
| Binder (50:35:15 (by mol) benzyl methacrylate-methacrylic acid-acrylic acid copolymer; molecular weight: 60,000) | 15 parts by weight |
| Solvent (methyl ethyl ketone) | 31 parts by weight |
| Solvent (methyl cellosolve acetate) | 26 parts by weight |
| Solvent (methoxy propanol) | 17 parts by weight |
| Additive (dioctyl phthalate) | 0.6 parts by weight |
| Solvent (n-propanol) | 76 parts by weight |
| Solvent (cyclohexanole) | 2 parts by weight |
| Acetone | 7 parts by weight |
| <Magenta toner coating solution: abbreviated as M1> | |
| Coloring material (pigment dispersion M1)(see Note 3 below) | 7.2 parts by weight |
| (Note 3) | |
| M1: Pigment dispersion having the following formulation: | |
| Pigment (Lionol red LX-235 produced by Toyo Ink Mfg. Co., Ltd.) | 12 parts by weight |
| Binder (67:33 benzyl methacrylate-methacrylic acid copolymer; molecular weight: 43,000) | 18 parts by weight |
| Solvent (methyl cellosolve acetate) | 37 parts by weight |
| Solvent (methyl propyl acetate) | 33 parts by weight |
| Additive (CRP (structural formula C)) | 0.6 parts by weight |
| Structural formula C (CRP) $O{=}P(-OCH(CH_2Cl)_2]_3$ | |
| Solvent (methyl ethyl ketone) | 80 parts by weight |
| Solvent (propylene glycol monomethyl ether acetate) | 40 parts by weight |
| <Yellow toner coating solution: abbreviated as Y1> | |
| Coloring material (Microlithyellow 2R-A produced by Ciba Geigy K.K. (see Note 4 below)) | 1.8 parts by weight |
| Additive (PET-4A) | 0.8 parts by weight |
| Solvent (methyl ethyl ketone) | 60 parts by weight |
| Solvent (propylene glycol monomethyl ether acetate) | 60 parts by weight |

(Note 4)

Processed pigment made of Microlithyellow 2R-A (Pigment yellow 83; C. I. 21108) and ethyl cellulose (binder).

Onto a 75-μm thick polyethylene terephthalate (PET) film as a support were each coated the above mentioned toner coating solutions by means of a rotary coater (whirler) at 120 rpm for 1 minute. The coat materials were each then dried at a temperature of 100° C. in an oven for 2 minutes to prepare toner elements having various hues. These toner layers had a thickness of 0.2 μm (black), 0.4 μm (cyan), 0.4 μm (magenta) and 0.2 μm (yellow.), respectively.

Image receiving layer coating solutions having the following formulations were then prepared.

| | |
|---|---|
| <1st image receiving layer> | |
| Polyvinyl chloride (Zeon 25 produced bu Nihon Zeon K.K.) | 9 parts by weight |
| Surface active agent (Megafac F-177P produced by Dainippon Ink And Chemicals, Incorporated) | 0.1 parts by weight |
| Methyl ethyl ketone | 130 parts by weight |
| Toluene | 35 parts by weight |
| Cyclohexanone | 20 parts by weight |
| Dimethyl formamide | 20 parts by weight |
| <2nd image receiving layer> | |
| Methyl methacrylate/ethyl acrylate/methacrylic acid copolymer (Dianal BR-77 produced by Mitsubishi Rayon Company Limited) | 17 parts by weight |
| Alkyl acrylate/alkyl methacrylate copolymer (Dianal BR-64 produced by Mitsubishi Rayon Company Limited) | 17 parts by weight |
| Pentaerythritol tetraacrylate (A-TMMT produced by Shinnakamura Kagaku K.K.) | 22 parts by weight |
| Surface active agent (Megafac F-177P produced by Dainippon Ink And Chemicals, Incorporated) | 0.4 parts by weight |
| Methyl ethyl ketone | 100 parts by weight |
| Hydroquinone monomethyl ether | 0.05 parts by weight |
| 2,2-Dimethoxy-2-phenylacetophenone (photopolymerization initiator) | 1.5 parts by weight |

Onto a 100-μm thick polyethylene terephthalate (PET) film as a support was coated the above mentioned 1st image receiving layer coating solution by means of a rotary coater (whirler). The coat material was then dried at a temperature of 100° C. in an oven for 2 minutes. The resulting 1st image receiving layer had a thickness of 1 μm.

Onto the 1st image receiving layer was then coated the 2nd image receiving layer coating solution in the same manner as used above to form a 2nd image receiving layer having a thickness of 26 μm. Thus, an image receiving element was obtained.

Using the same light-sensitive element and black toner element as prepared in Example 8, a multi-color image was formed in the following manner:

A black toner image was formed on the black toner element in the same manner as used in Example 1. The black toner element was then laminated with the image receiving element in such an arrangement that the black toner image was brought into contact with the image receiving layer. The lamination was then effected at a temperature of 125° C. under a pressure of 4.5 kg/cm$^2$ at a rate of 900 mm/min. After being allowed to cool to room temperature, the image receiving element and the toner element were peeled off each other. As a result, the image which had been on the support for the toner layer was confirmed to have been transferred to the image receiving element.

With a fresh light-sensitive layer, a cyan toner image was formed on a toner element support in the same manner as effected above. The cyan toner image was then superimposed on the image receiving layer on which the black toner image had been formed in such an arrangement that the recorded lines crossed each other. The lamination and peeling were effected in the same manner as effected above. It was then confirmed that black lines and cyan lines had been favorably transferred perpendicular to each other on the image receiving layer.

The same procedure was repeated with the magenta toner and yellow toner elements. As a result, an image made of four color toner layers was formed on the image receiving element.

The image receiving layer on which the four-color toner layers had been transferred was then laminated with an art paper for use in printing. The lamination was effected at a temperature of 125° C., a pressure of 4.5 kg/$cm^2$ and a rate of 450 mm/min. The laminate was then entirely irradiated on the image receiving element side with light from a 2-kW ultrahigh pressure mercury vapor lamp disposed at a distance of 50 cm therefrom. The image receiving element was then peeled off the material. It was then confirmed that the four-color toner image layers had been transferred to the art paper while favorably glued to each other. The image thus obtained exhibited an excellent resolving power, no hue change and very little visually observable defects.

EXAMPLE 10

A coating solution for light-sensitive layer having the following formulation was prepared.

| | |
|---|---|
| Binder (33% methyl cellosolve acetate solution of 67:33 (by mol) benzyl methacrylate-methacrylate acid copolymer) | 45.5 parts by weight |
| Photopolymerizable monomer: | |
| Tetraethylene glycol diacrylate | 3.0 parts by weight |
| Pentaerythritol tetraacrylate | 5.0 parts by weight |
| Initiator D (structural formula D) | 0.6 parts by weight |
| Structural formula D | |
| 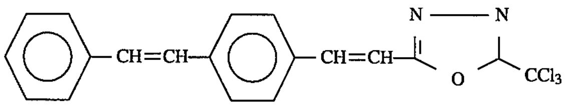 | |
| Surface active agent (Florad FC-430 produced by Sumitomo 3M) | 0.1 parts by weight |
| Methyl ethyl ketone | 110 parts by weight |
| Propylene glycol monomethyl ether acetate | 55 parts by weight |

Using this coating solution, a light-sensitive element was prepared in the same manner as in Example 8. The resulting light-sensitive layer had a thickness of 2.0 μm. Besides the light-sensitive element, a toner film and an image receiving element were prepared in the same manner as in Example 8.

The light-sensitive element was then irradiated with ultraviolet rays from a 2-kW ultrahigh pressure mercury vapor lamp through a four color separation image mask. Using toner films having the corresponding hues, development was effected in the same manner as in Example 1. With the four colors in registration, the image formed on the toner element was then transferred to the image receiving element under the same conditions as used in Example 1. The image was then transferred to an art paper. The image thus obtained exhibited 2 to 98% halftone dots per 150 lines and an excellent scuff resistance.

COMPARATIVE EXAMPLES 9–10

A toner image was formed and then transferred to an image receiving element and then to an art paper in the same manner as in Examples 1 and 2 except that the plasticizer was excluded from the coating solution for each color toner of Example 10. The first color image was favorably transferred to the image receiving layer. However, the second and following color images were insufficiently transferred and their image qualities were not fit for use.

EXAMPLE 11

Image formation and evaluation were effected in the same manner as in Example 10 except that a 15-μm thick layer of ethylene-vinyl acetate copolymer (Evaflex 40Y produced by Mitsui Petrochemical Industries, Ltd.) additionally was used as an interlayer. Excellent results were obtained in respect to sensitivity and resolving power as well as defects.

EXAMPLE 12

An interlayer coating solution having the following formulation was prepared.

| | |
|---|---|
| Polymer: | |
| 75:25 (wt %) copolymer of vinyl chloride and vinyl acetate (MPR-T5 produced by Nisshin Kagaku K.K.; polymerization degree: about 400) | 15 parts by weight |
| 86:13:1 (wt %) copolymer of vinyl chloride, vinyl acetate and maleic acid (MPR-TM produced by Nisshin Kagaku K.K.; polymerization degree: about 400) | 5 parts by weight |
| Plasticizer (dibutyl phthalate) | 0.4 parts by weight |
| Surface active agent (Florad FC-430 produced by Sumitomo 3M) | 0.25 parts by weight |
| Solvent (methyl ethyl ketone) | 100 parts by weight |

Onto a 100-μm thick PET film as a support was coated the above mentioned coating solution by means of a rotary coater. The material was then dried to obtain a 20-μm thick interlayer. Onto the interlayer was coated a light-sensitive layer in the same manner as in Example 1 to prepare a light-sensitive element. The light-sensitive element had a thickness of 3 μm.

Image formation and evaluation were then effected in the same manner as in Example 1. Excellent results were obtained in respect to sensitivity and resolving power as well as defects.

EXAMPLE 13

Onto a 100-μm PET film was directly coated the same light-sensitive layer coating solution as prepared in Example 10 in the same manner as in Example 8. The thickness of the light-sensitive layer was 3 μm.

The light-sensitive layer was then superimposed on a 25-μm polyethylene film laminated with a 75-μm thick PET film. The laminate was then passed through a laminatot at a temperature of 120° C., a pressure of 4.5 $kg/cm^2$ and a rate of 450 mm/min. The material was then irradiated with ultraviolet rays under the same conditions as used in Example 1. When the polyethylene film was peeled off the light-sensitive element, the light-sensitive layer was transferred to the polyethylene side. The light-sensitive layer was laminated with the same black toner element as used in Example 10, and then developed under the same conditions as used in Example 10. The image thus obtained exhibited an excellent definition. Further, since the 25-μm thick polyethylene film served as an interlayer, there were visually observed very little defects.

EXAMPLES 14a–14d, COMPARATIVE EXAMPLE 11

As a magenta toner layer coating solution, a dispersion having the following formulation was prepared.

| | |
|---|---|
| Coloring material (pigment dispersion M1 (same as M1 of Example 9)) | 7.2 parts by weight |
| Additive (plasticizer; PET-4A) (amount varied from 0 to 40% by weight based on the total weight of pigment and binder, providing additives a to e) | 0 to 0.6 parts by weight |
| Solvent (methyl ethyl ketone) | 80 parts by weight |
| Solvent (propylene glycol monomethyl ether acetate) | 40 parts by weight |

Using this coating solution, a magenta toner element having a different amount of a plasticizer from Example 9 was prepared in the same manner as in Example 9.

A light-sensitive element, black and yellow toner elements, and an image receiving element were prepared in the same manner as in Example 8 or 9. Then, the black and yellow toner layers were subsequently trasferred to the image receiving element in the same manner as in Example 9. Onto the yellow image were then transferred the toner films a to e with the laminator temperature varied. The laminating temperature at which the toner films could be successfully transferred to the image receiving element are set forth in Table 3.

TABLE 3

| Specimen | Evaluation of transferable temperature: Added amount of plasticizer (wt %) | Transferable temperature (°C.) |
|---|---|---|
| a (Example 14a) | 10 | 120 |
| b (Example 14b) | 20 | 100 |
| c (Example 14c) | 30 | 80 |
| d (Example 14d) | 40 | 70 |
| e (Comparative Example 11) | 0 | Nontransferable at 150° C. (deformed to image receiving layer support) |

EXAMPLES 15f–15h, COMPARATIVE EXAMPLE 12

Light-sensitive layers, toner elements and image receiving elements were prepared in the same manner as in Example 9 except that as the plasticizer to be incorporated in the cyan toner layer coating solution of Example 9 there was used a compound of the structural formula E shown in Examples 4f–4h(Type MP-14 produced by Daihachi Kagaku K.K.) in different amounts to prepare Specimens f to i.

A transfer test was made on the image receiving element after the black image had been transferred to the image receiving layer in the same manner as in Example 9. The results are set forth in Table 4.

Table 4 shows that the more MP-14 was added, the better was the transferability as well as the image quality. However, it is also shown that when MP-14 was added in too large an amount, the cohesive failure of the toner layer occurred upon development, deteriorating the image quality.

TABLE 4

| Specimen | Results of evaluation: Added amount of plasticizer (wt % based on the total amount of pigment and monomer) | Transferability to image receiving element | Image quality |
|---|---|---|---|
| f (Example 14f) | 12 | Excellent | Almost excellent |
| g (Example 15g) | 24 | Excellent | Excellent |
| h (Example 15h) | 100 | Fair | Slightly poor on nonimage portion (cohesive failure of toner layer) |
| i (Comparative Example 12) | 0 | Poor | Poor on shadow portion |

EXAMPLE 16, COMPARATIVE EXAMPLE 13

Specimens were prepared in the same manner as in Example 9 except that the CRP to be used as a plasticizer for the magenta layer was replaced by DOP, TPP, CDP (structural formula F shown in Example 5), and BDP (structural formula G shown in Example 5), respectively. Images were transferred after the cyan image was transferred to the image receiving layer for evaluation. In the case where no plasticizer was used (Comparative Example 13), all the specimens showed a poor image quality on the printing paper. On the other hand, the specimens comprising these plasticizers incorporated therein (Example 16) exhibited excellent image quality and hue and very little visually observable defects.

EXAMPLE 17, COMPARATIVE EXAMPLE 14

Specimens were prepared in the same manner as in Example 9 except that the DOP to be used as a plasticizer for the cyan layer was replaced by MP-10 (plasticizer (structural formula H shown in Example 6) produced by Daihachi Kagaku K.K.) and MP-16 (plasticizer (structural formula I shown in Example 6) produced by Daihachi Kagaku K.K.), respectively. Images were transferred after the black image was transferred to the image receiving layer for evaluation. In the case where no plasticizer was used (Comparative Example 14), all the specimens showed a poor image quality on the printing paper. On the other hand, the specimens comprising these plasticizers incorporated therein (Example 17) exhibited excellent image quality and hue and very little visually observable defects.

EXAMPLE 18, COMPARATIVE EXAMPLE 15

Light-sensitive layers, toner elements and image receiving elements were prepared in the same manner as in Example 2 except that as the plasticizer to be incorporated in the cyan toner layer coating solution of Example 9 there was used PET-4A in different amounts to prepare Specimens j to n.

A transfer test was effected on the image receiving element after the black image was transferred to the image receiving layer in the same manner as effected in Example 9. Further, a pressure-sensitive adhesive tape was laminated on the cyan toner layer. The adhesion F1 between the support for the toner element and the toner layer was then measured by means of a tensile tester (tensilon). The results are set forth in Table 5.

Table 5 shows that the addition of a plasticizer allowed the transfer to the image receiving element. It is also shown that as the added amount of the plasticizer increased, the laminating temperature required for transfer decreased. It can thus be seen that one of the factors for improving the transferability is the drop in the adhesion F1 between the toner layer and the support.

TABLE 5

| | Results of evaluation | | | | |
|---|---|---|---|---|---|
| Specimen | j | k | l | m | n |
| Added amount of PET-4A (Note 5) | 0 (Comparative) | 10 (Example) | 20 (Example) | 30 (Example) | 40 (Example) |
| Four-color transferable temperature (°C.) (Note 6) | Nontransferable at 135° C. | Nontransferable at 135° C. | 130 | 120 | 100 |
| Peel force F1 (g/cm) | 170 | 160 | 155 | 90 | 30 |

(Note 5) Wt % based on the total weight of pigment and binder
(Note 6) Black, cyan, magenta and yellow transferred to the image receiving element in this order While the invention has been described in detail and with reference to specific embodiments thereof, it will be apparent to one skilled in the art that various changes and modifications can be made therein without departing from the spirit and scope thereof.

What is claimed is:

1. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder an a coloring material having at least a hue (a), and a second toner element comprising on a support a toner layer (b') containing a binder and a coloring material having at least a hue (b) different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing the adhesive surface of an image receiving element comprising on a support an image receiving layer having a surface adhesive to said first toner layer into face-to-face contact with the surface of the toner layer of said first toner element on which the toner layer has been left corresponding to the exposed portion of said first light-sensitive layer;

E) separating said image receiving element and said first toner element from each other to transfer the toner layer to said image receiving element;

F) repeating said steps A) to C) with said second light-sensitive element and said second toner element comprising said toner layer (b'); and G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element.

2. An image formation process as claimed in claim 1, wherein said first and second toner layers contain at least one plasticizer.

3. An image formation process as claimed in claim 2, wherein said plasticizer is selected from the group consisting of ester phosphates, ester acrylates, polyol esters and epoxy compounds.

4. An image formation process as claimed in claim 3, wherein the amount of the plasticizer to be contained in said first and second toner layers is in the range of 2 to 100% by weight based on the total weight of the coloring materials and binders forming said toner layers.

5. An image formation process as claimed in claim 2, wherein said binder is an organic polymer having a molecular weight of 10,000 or more.

6. An image formation process as claimed in claim 2, wherein said binder is an organic polymer having a glass transition temperature of not lower than room temperature.

7. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (b) different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing an image receiving element comprising on a support an image receiving layer having a surface adhesive to said first toner layer into face-to-face contact with said first toner element on which the first toner layer has been left corresponding to the exposed portion of the light-sensitive layer;

E) separating said image receiving element and said first toner element from each other to transfer the toner layer which has been left corresponding to the exposed portion of said first light-sensitive layer to said image receiving element;

F) repeating said steps A) to C) with said second light-sensitive element and said second toner element comprising said toner layer (b'); and G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element, characterized in that said light-sensitive element includes between said light-sensitive layer and said support a layer comprising a light-sensitive polymer and having a softening temperature of 80° C. or lower as determined by the Vicat process.

8. An image formation process as claimed in claim 7, wherein said layer having a softening temperature of 80° C. or lower as determined by the Vicat process contains an ethylene polymer or copolymer.

9. An image formation process as claimed in claim 8, wherein said ethylene copolymer is an ethylene-vinyl acetate copolymer or an ethylene-ester acrylate copolymer.

10. An image formation process as claimed in claim 7, wherein the thickness of said layer having a softening temperature of 80° C. or lower as determined by the Vicat process is in the range of 3 to 100 μm.

11. An image formation process as claimed in claim 7, wherein said light-sensitive layer is a photopolymerizable layer.

12. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (a) different from the hue (b), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing the adhesive surface of an image receiving element comprising on a support an image receiving layer having a surface adhesive to said first toner layer into face-to-face contact with the surface of the toner layer of said first toner element on which the toner layer has been left corresponding to the exposed portion of said first light-sensitive layer;

E) separating said image receiving element and said first toner element from each other to transfer the toner layer to said image receiving element;

F) repeating said steps A) to C) with said second light-sensitive element and said second toner element comprising said toner layer (b'); and G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element, characterized in that the process further comprises a step of bringing said image receiving element comprising a toner layer formed in the step (G) into face-to-face contact with a final support under heating and/or pressure and then separating said image receiving element and said final support from each other to simultaneously transfer multi-color toner layers on said image receiving layer to said support.

13. An image formation process with first and second light-sensitive elements comprising on separate supports first and second light-sensitive layers which are adhesive when not exposed to actinic light but become nonadhesive after being exposed to actinic light, respectively, a first toner element comprising on a support a toner layer (a') containing a binder and a coloring material having at least a hue (a), and a second toner element comprising on a support a toner layer (b') containing a binder and a coloring material having at least a hue (b) different from the hue (a), which comprises the steps of:

A) imagewise exposing said first light-sensitive layer to actinic light to form a latent image therein;

B) bringing said first light-sensitive layer thus exposed into face-to-face contact with said toner layer (a') in said first toner element;

C) separating said first toner element and said first light-sensitive element from each other to transfer the portion of the toner layer corresponding to the unexposed portion of the light-sensitive layer to the light-sensitive layer and leave the portion of the toner layer corresponding to the exposed portion of the light-sensitive layer on the support for said first toner element;

D) bringing the adhesive surface of an image receiving element comprising on a support an image receiving layer having a surface adhesive to said first toner layer into face-to-face contact with the surface of the toner layer of said first toner element on which the toner layer has been left corresponding to the exposed portion of said first light-sensitive layer;

E) separating said image receiving element and said first toner element from each other to transfer the toner layer to said image receiving element;

F) repeating said steps A) to C) with said second light-sensitive element and said second toner element comprising said toner layer (b');

G) bringing the surface of the transferred toner layer of said image receiving element on which the toner layer having a hue (a) has been transferred into face-to-face contact with the surface of the toner layer having a hue (b) which has been imagewise prepared and left at the step (F) and separating said image receiving element and said second toner element from each other to transfer the toner layer having a hue (b) to said image receiving element; and H) bringing said image receiving element comprising a toner layer formed in the step (G) into face-to-face contact with a final support under heating and/or pressure and then separating said image receiving element and said final support from each other to simultaneously transfer multi-color toner layers on said image receiving layer to said support, characterized in that said light-sensitive element includes between said light-sensitive layer and said support a layer substantially made of a light-insensitive polymer and having a softening temperature of 80° C. or lower as determined by the Vicat process.

14. An image formation process as claimed in claim 13, wherein said layer having a softening temperature of 80° C. or lower as determined by the Vicat process contains an ethylene polymer or copolymer.

15. An image formation process as claimed in claim 14, wherein said ethylene copolymer is an ethylene-vinyl acetate copolymer or an ethylene-ester acrylate copolymer.

16. An image formation process as claimed in claim 13, wherein the thickness of said layer having a softening temperature of 80° C. or lower as determined by the Vicat process is in the range of 3 to 100 μm.

17. An image formation process as claimed in claim 13, wherein said light-sensitive layer is a photopolymerizable layer.

18. An image formation process as claimed in claim 2, wherein among said toner layers (a') and (b') having different hues (a) and (b) formed on said image receiving element, the adhesion F1b between said toner layer (b') transferred after said toner layer (a') and the support for said toner layer (b') is smaller than any of the adhesion F2ab between said toner layer (a') and said toner layer (b'), the adhesion F3a and F3b between said image receiving element and said toner layer (a') and said toner layer (b'), respectively, and the coercive force F4a and F4b of said toner layer (a') and said toner layer (b'), respectively.

19. An image formation process as claimed in claim 13, wherein among said toner layers (a') and (b') having different hues (a) and (b) formed on said image receiving element, the adhesion Flb between said toner layer (b') transferred after said toner layer (a') and the support for said toner layer (b') is smaller than any of the adhesion F2ab between said toner layer (a') and said toner layer (b'), the adhesion F3a and F3b between said image receiving element and said toner layer (a') and said toner layer (b'), respectively, and the coercive force F4a and F4b of said toner layer (a') and said toner layer (b'), respectively.

* * * * *